US012453006B2

(12) United States Patent
Zolfaghari et al.

(10) Patent No.: US 12,453,006 B2
(45) Date of Patent: Oct. 21, 2025

(54) INDUCED CIRCUITRY WITHIN A HARD DIAMOND-LIKE AND CARBON-RICH LAYER HAVING SENSING ABILITIES

(71) Applicant: Schlumberger Technology Corporation, Sugar Land, TX (US)

(72) Inventors: Alireza Zolfaghari, Sugar Land, TX (US); Manuel Marya, Sugar Land, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 569 days.

(21) Appl. No.: 17/818,203

(22) Filed: Aug. 8, 2022

(65) Prior Publication Data

US 2024/0049385 A1 Feb. 8, 2024

(51) Int. Cl.
*H05K 1/09* (2006.01)
*E21B 34/06* (2006.01)

(52) U.S. Cl.
CPC .............. *H05K 1/09* (2013.01); *E21B 34/066* (2013.01); *E21B 2200/02* (2020.05); *H05K 2201/0323* (2013.01)

(58) Field of Classification Search
CPC .............................. H05K 1/09; E21B 2200/02
See application file for complete search history.

(56) References Cited

U.S. PATENT DOCUMENTS 8,882,872 B2 * 11/2014 Mazyar .................... B01J 3/062 977/734
2010/0108403 A1 * 5/2010 Keshavan ........... C23C 16/0272 175/428

(Continued)

FOREIGN PATENT DOCUMENTS

| | | | |
|---|---|---|---|
| CN | 114665114 | A | 6/2022 |
| KR | 20200144652 | A | 12/2020 |
| WO | 2021089564 | A1 | 5/2021 |

OTHER PUBLICATIONS

International Search Report and the Written Opinion issued in the PCT Application No. PCT/US2023/029681 dated Nov. 24, 2023, 12 pages.

(Continued)

*Primary Examiner* — Jamel E Williams
(74) *Attorney, Agent, or Firm* — Jeffrey D. Frantz

(57) ABSTRACT

A system may include a substrate and a coating deposited onto a surface of the substrate. The coating includes a carbon rich layer deposited on the substrate. The carbon rich layer is also characterized by a first carbon content including $sp^2$ carbon and $sp^3$ carbon. Further, the carbon rich layer includes one or more treated carbon regions. The one or more treated carbon regions possess an electrically conductive carbon material having a second carbon content including $sp^2$ carbon and $sp^3$ carbon. The second carbon content includes more $sp^2$ carbon than the first carbon content, and may be pre-arranged and interconnected to produce an electrical circuitry with a pluralities of sensing abilities. The formed smart coating may be preferentially produced on a hard diamond-like carbon coating, such as a low friction and anti-scaling coating.

19 Claims, 14 Drawing Sheets

(56) References Cited

U.S. PATENT DOCUMENTS

| | | | | |
|---|---|---|---|---|
| 2018/0320513 | A1* | 11/2018 | Scott | E21B 47/00 |
| 2024/0230465 | A1 | 7/2024 | Zolfaghari | |

OTHER PUBLICATIONS

Zivelonghi et al., "Laser decoating of DLC films for tribological applications," Int J Adv Manuf Technol, vol. 93, p. 1715, 2017. (10 pages).
Radek et al., "Influence of laser texturing on tribological properties of DLC coatings," Production Engineering Archives , vol. 27, No. 2, pp. 119-123, 2021.
Dumitru et al., "Laser treatment of tribological DLC films," Diamond and Related Materials, vol. 12, p. 1034-1040, 2003.
Nister et al., "Direct Observation of Laser-Induced Crystallization of a-C: H Films," Appl. Phys. A, vol. 58, pp. 137-144, 1994.
Tao et al., "An intelligent artificial throat with sound-sensing ability based on laser induced graphene," Nature Communications, vol. 8, p. 14579, 2017 (8 pages).
Tao et al., "A Flexible 360-Degree Thermal Sound Source Based on Laser Induced Graphene.," Nanomaterials, vol. 6, pp. 1-8, 2016.
Zhang et al., "Monolithic and Flexible ZnS/SnO2 Ultraviolet Photodetectors with Lateral Graphene Electrodes," Small, vol. 13, No. 18, p. 1604197, 2017 (7 pages).
Rahimi et al., "Highly Stretchable and Sensitive Unidirectional Strain Sensor via Laser Carbonization," ACS Appl. Mater. Interfaces, vol. 8, p. 4463-4470, 2015.
Vanegas et al., "Laser Scribed Graphene Biosensor for Detection of Biogenic Amines in Food Samples Using Locally Sourced Materials," Biosensors, vol. 8, No. 2, p. 42, 2018. (19 pages).
Nayak et al., "Highly Efficient Laser Scribed Graphene Electrodes for On-Chip Electrochemical Sensing Applications," Advanced Electronic Materials , vol. 2, No. 10, 2016. (11 pages).
Fenzl et. al., "Laser-Scribed Graphene Electrodes for Aptamer-Based Biosensing," ACS Sensors , vol. 2, No. 5, pp. 616-620 , 2017.
Nag et. al., "Sensing system for salinity testing using laser-induced graphene sensors," Sensors and Actuators A: Physical, vol. 264, pp. 107-116, 2017.
Tan et. al., "Transient laser heating induced hierarchical porous structures from block copolymer-directed self-assembly," Science, vol. 349, No. 6243, p. 54, 2015 (5 pages).

* cited by examiner

INDUCED CIRCUITRY WITHIN A HARD DIAMOND-LIKE AND CARBON-RICH LAYER HAVING SENSING ABILITIES

BACKGROUND

The subject matter disclosed herein relates to systems and methods for a smart carbon coating having one or more hard carbon-rich layers with one or more treated carbon regions. More specifically, the subject matter disclosed herein relates to a smart carbon coating, induced and created from a hard carbon material such as a diamond-like carbon coating, wherein by having one or more treated carbon regions with greatly different electrical properties the assessment of these electrical properties from the treated carbon portions determines at a surface coated with the smart carbon coating some changes in force, stress, pressure, displacement, strain, water (liquid, vapor including humidity), and/or the presence of material buildups, including scale deposits, among others.

A variety of equipment, for instances general pressure vessels and heavy pressurized structures, may be subjected to severe environmental and operational conditions, potentially leading to structural failures through a variety of progressive changes, including mechanical failures due to fatigue, corrosion in its various forms among uniform corrosion, stress-corrosion cracking, hydrogen-induced cracking, or other changes such as adherent scale buildups such as calcite deposits in water-producing conduits, among others. The equipment may include surface equipment deployed on land or floating infrastructures at normal atmospheric conditions, subsea equipment, deployed underwater under hydrostatic pressure, or downhole equipment used with subterranean reservoirs. For example, the equipment may include hydrocarbon extraction equipment used for the production of hydrocarbon streams (e.g., oil and/or gas) from a well. The equipment also may include sequestration equipment configured to inject and control the storage of fluids (e.g., liquid water, steam, gases such as carbon dioxide, hydrogen, among others) in a subterranean reservoir. For example, the sequestration equipment may be part of carbon capture and storage (CCS) infrastructures at surface, subsea or downhole. The foregoing equipment may include, for example, tubular components, hangers, valves, chokes, packers, pumps, or other associated fluid handling equipment required for the injection and storage of carbon (carbon dioxide). In any case, it may be difficult to monitor any gradual changes prior to any potential structural failures because the surfaces subject to the harsh conditions may be difficult to access, including positioned deep in a well. When a piece of equipment with one or several of its surfaces covered with one or more coatings, it is generally challenging, if not impractical, to determine the structural integrity of this coating regardless of the coating characteristics. A hard coating such as one comprising carbon and usually defined as a diamond-like carbon coating (DLC) may offer advantages in terms of wear resistance, reduced friction, anti-scaling, even anti-icing, and it may be highly desirable to enrich the coating with sensing capabilities so as to broadly sense, monitor, or ultimately conduct some prognostic health monitoring of equipment pieces.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In certain embodiments, the present disclosure relates to a system. The system includes a substrate and a coating deposited onto a surface of the substrate. The coating includes a carbon rich layer deposited on the substrate. The carbon rich layer also includes a first carbon content characterized by its $sp^2$ carbon and $sp^3$ carbon. Further, the carbon rich layer includes one or more treated carbon regions. The one or more treated carbon regions include an electrically conductive carbon material having a second carbon content characterized by its $sp^2$ carbon and $sp^3$ carbon. The second carbon content of the treated region includes more $sp^2$ carbon than the first carbon content.

In certain embodiments, the present disclosure relates to a system. The system includes a surface monitoring system that measures data indicative of a change in surface characteristics of a coating applied to a downhole component. The coating includes a carbon rich layer deposited on the substrate. The carbon rich layer also includes a first carbon content characterized by its $sp^2$ carbon and $sp^3$ carbon. Further, the carbon rich layer includes one or more treated carbon regions. The one or more treated carbon regions include an electrically conductive carbon material having a second carbon content including $sp^2$ carbon and $sp^3$ carbon. The second carbon content includes more $sp^2$ carbon than the first carbon content. The system also includes a non-transitory machine-readable medium and executable by a processor to identify the change in the surface characteristics in response to the data and output an indication of the change.

In certain embodiments, the present disclosure relates to a method. The method includes applying one or more carbon rich layers to a substrate. The one or more carbon rich layers comprise a first carbon content characterized by its $sp^2$ carbon and $sp^3$ carbon. The method also includes treating a portion of the one or more carbon rich layers with a focused energy source to generate a pattern of electrically conductive carbon. The electrically conductive carbon comprises a second carbon content comprising more $sp^2$ carbon than the first carbon content.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
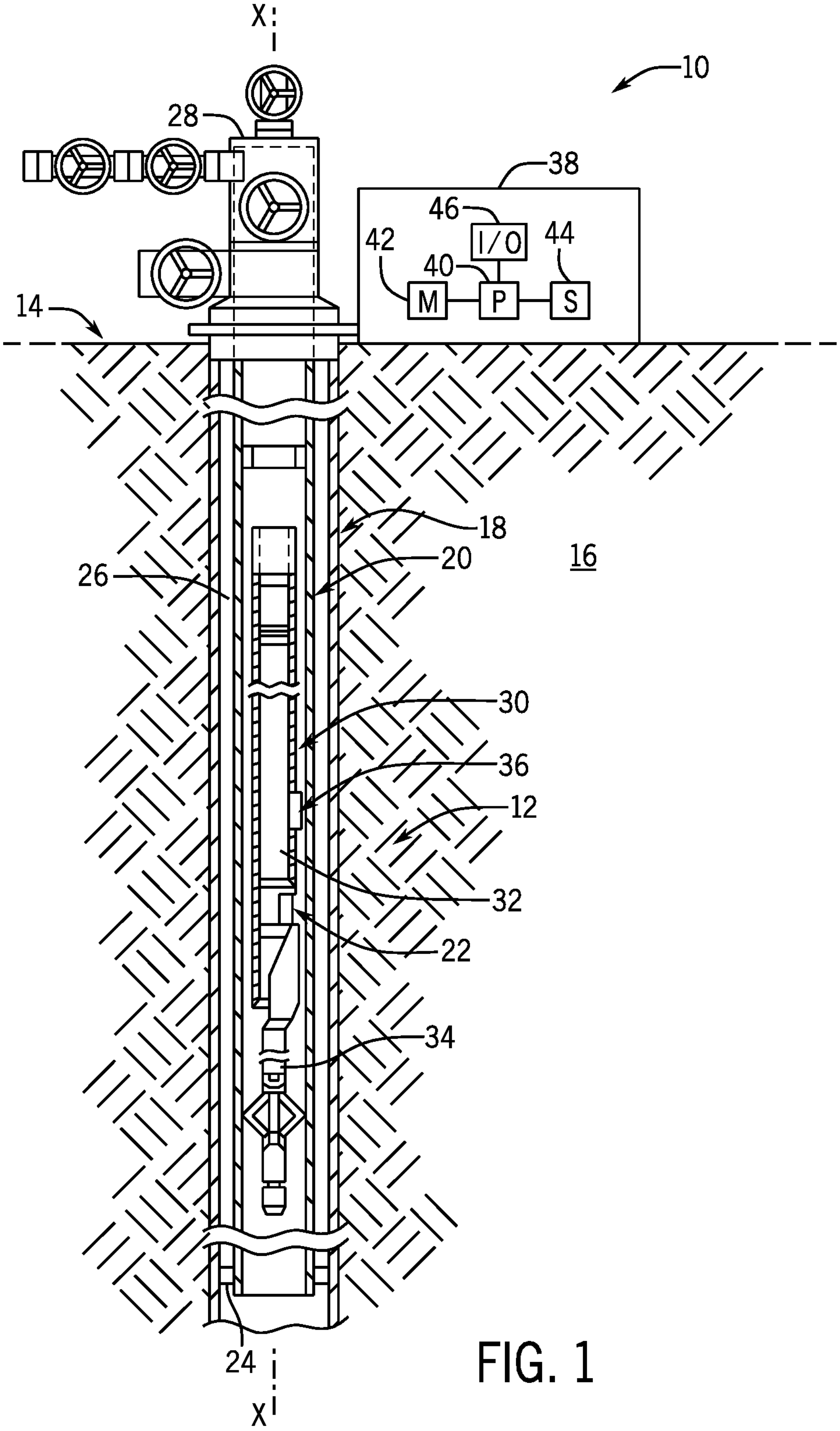
FIG. 1 is a schematic diagram of an embodiment of a wellsite having one or more components with a smart carbon coating.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As generally discussed above, certain equipment, such as downhole components (e.g., tubular components, hangers, valves, chokes, packers, pumps, etc.) may be operated under severe conditions that challenge the safe operational limits of the equipment during its intended life span. For instances, these conditions may be generating elevated mechanical stresses on the equipment, and/or be associated to fluids or chemicals that may cause a detrimental chemical or electrochemical change to surfaces of the equipment, which may result in damage or end-of-life failure. To decrease risk of equipment damage and failure, it is presently recognized that it may be advantageous to provide a coating onto one or more surfaces. This coating may be considered as a protective coating and may be particularly resistant to wear and abrasion when it is hard, lubricious, and adherent to the substrate. Additionally, this coating may be such that it is capable to detect an otherwise non-measurable change in a coating property, the latter resulting from chemical (including electrochemical) and/or mechanical changes (e.g., due to force, stress, pressure, displacement, strain, water, humidity, fluids in contact with an interior and/or exterior surface of the equipment, and the like) to the surface of the coating. Moreover, it may be advantageous to produce or generate such a smart coating by functionalizing a carbon rich-coating, having a suitable hardness (e.g., having a Vickers hardness greater than 750 HVN, greater than 900 HVN, greater than 1050 HVN, greater than 1200 HVN, greater than 1350 HVN, or greater than 1500 HVN) with a circuitry capable of producing a detectable signal due to chemical or mechanical changes to a surface of a downhole component, such as force, pressure, displacement, stress, water, strain, humidity, presence of material buildups including scale deposits. The stress may be directly applied, or be the result of another event; for instance, shocks, scale adhesion, thermal change, etc., or chemical interactions.

Accordingly, the present disclosure is directed to techniques for generating and utilizing a smart carbon coating (e.g., smart carbon rich coating) having at least one carbon rich layer having a treated carbon rich portion. In general, the treated carbon rich portion may be formed by laser-treatment, or otherwise treating the non-conductive carbon rich layer, such that the treated carbon rich portion becomes more electrically conductive (e.g., having a lower sheet electrical resistance) than the carbon rich layer (e.g., an untreated portion of the carbon rich layer). For example, the carbon rich layer may be treated with an illumination source such as a laser source, such by irradiating a surface of one or more layers of the carbon rich layer with a suitable exposure of a laser an electrically conductive carbon materials (e.g., graphene, graphite, and others) is formed. By generating the electrically conductive materials, the smart coating is characterized by some improved electrical conductance (e.g., resulting from a reduced sheet electrical resistance) as compared to not treating the carbon rich layer. That is, the treated carbon rich portion includes electrically conductive carbon materials such that treated carbon rich portion is an electrically conductive carbon layer, while the untreated portion of the carbon rich layer is relatively less conductive or substantially a non-conductive carbon layer (e.g., formed of electrically insulating materials). For example, the treated carbon portion may be treated such that the sheet electrical resistance of the smart carbon coating includes the treated carbon rich portion has a sheet electrical resistance that is greater than 100 times less than, greater than 200 times less than, or greater than 300 times less than that of the untreated carbon rich layer. In any case, the electrical properties of the disclosed smart carbon coating may vary due to exposure of the equipment to certain conditions (e.g., strain, stress, fluids, humidity, scale deposition). Accordingly, the disclosed smart carbon coating may facilitate detecting exposure of the surface of the equipment (e.g., downhole components) to chemical and/or mechanical conditions, which result in one or more changes in the electrical properties of the smart carbon coating. In this way, the disclosed smart carbon coating may enable monitoring of equipment coated with the disclosed smart carbon coating to reduce a likelihood of the equipment working in an unexpected manner or otherwise failing.

With the foregoing in mind, FIG. 1 illustrates a subterranean well system 10 that may utilize the disclosed smart carbon coating. In some embodiments, the subterranean well system 10 may include a well closure system, a mineral extraction system, and/or a hydrocarbon extraction system. It should be noted that although the discussion of FIG. 1 relates to a well closure system, embodiments of the present disclosure may be utilized in any subsurface application where hydrocarbons are produced and injection systems where liquid water, steam, gases such as carbon dioxide, hydrogen, or other fluids such as supercritical carbon dioxide or mineral-rich brines are sequestered or produced from a surface or subsea. In a well closure system, one or multiple closure devices 12 (e.g., for plugging a well) may be lowered into a wellbore 14 (e.g., installed and anchored within the wellbore 14) prior to certain operations, such as well production. The closure device 12 may be lowered into the wellbore 14 as a first installation, to replace a previously installed closure device 12, or to add an additional closure device 12. In any case, the closure device 12 is configured to control flow from the reservoir such that it goes in at the specific manage points (e.g., perforations, valves, and the like). For example, the closure device 12 may block a flow of formation (reservoir) fluid from reaching a surface location above a geological formation 16 (e.g., via conduits such as a casing conduit 18 and/or a production casing conduit 20), which flow may result from high pressure conditions that arise during well production. The closure device 12 may include a valve 22, such as a subsurface valve. For example, the valve 22 may include a gate valve, a ball valve, a linear piston valve, a check valve, or any combination thereof. As shown in this configuration of the wellbore 14, the wellbore completion includes a casing conduit 18 and a production casing conduit 20 (e.g., production tubing) with an annular sealing element 24 (e.g., metal and/or elastomeric seal) that seals an annular space 26 defined between the casing conduit 18 and the production casing conduit 20. The wellbore 14 may include a wellhead 28 at the surface of the subterranean well system 10 that may selectively seal the casing conduit 18 and/or the production casing conduit 20.

In the illustrated example of FIG. 1, the closure device 12 includes a valve housing 30 having a valve 22, an actuation subsystem 32 (e.g., an actuator), and a valve controller 34. The closure device 12 is sealed in the production tubing by a sealing element, so that the fluid may not reach the surface if it does not pass through the valve 22. In certain embodiments, the valve 22 may include a gate valve, a ball valve, or another suitable valve configured to open and close the fluid flow. For example, the valve 22 may include a flapper that can switch between an open position to enable fluid flow and a closed position to block the fluid flow. The actuation subsystem 32 may include an electric actuator, a fluid-driven actuator (e.g., a hydraulic actuator), a mechanical actuator (e.g., a hand wheel), a spring biasing element (e.g., a mechanical spring) configured to bias the valve to an open or closed position, or any combination thereof. For example, the actuation subsystem 32 includes a biasing component 36 (e.g., a pressurization piston coupled to a mechanical spring) to maintain the valve 22 in a default position (e.g., open or closed). The valve controller 34 is configured to control and/or adjust a position of components of the closure device 12 (e.g., the valve 22) via the actuation subsystem 32 to block the flow of formation fluid from reaching the surface or to enable the fluid to flow toward the surface. In certain embodiments, the valve 22 and/or one or more additional valves may be used to control fluid flow from the surface to a downhole location, such as by injecting one or more fluids such as water, carbon dioxide, hydrogen, among others.

It should be noted that the actuation subsystem 32 and the valve housing 30 may be configured to operate with or without use of fluid or electrical control lines extending from the surface into the wellbore 14. For example, electrical power and/or fluid pressure may be provided from the surface using one or more electrical generators, a power grid, batteries, pumps, or a combination thereof. Additionally, or alternatively, the actuation subsystem 32 may be powered by one or more local power supplies, such as a battery pack, at the location of the valve 22.

The illustrated embodiment of the closure device 12 includes the valve controller 34 that may be utilized to adjust the position of the components in the valve housing 30. The valve controller 34 controls and/or adjusts a position of the valve 22 between open and closed positions (e.g., via the actuation subsystem 32). For example, the valve controller 34 may control and/or adjust the valve 22 based on control signals and/or messages that are transmitted by a transmitter of a transmitter subsystem 38.

In some embodiments, the transmitter subsystem 38 may receive sensor measurements (e.g., temperature sensor measurements, pressure sensor measurements, flow-rate sensor measurements, fluid composition measurements such as salinity levels, other parameters relating to the formation of scale deposits, or any combination thereof). The sensor measurements may be directed by surface sensors, downhole sensors, or completion sensors to the transmitter subsystem 38 via any suitable telemetry (e.g., via electrical signals pulsed through the geological formation 16 or via mud pulse telemetry). In some embodiments, the transmitter subsystem 38 may receive inputs from a user interface (e.g., a graphical user interface) controlled by an operator. The transmitter subsystem 38 may process the sensor measurements and/or user inputs to determine a condition within the wellbore 14 or at the surface and determine whether to adjust the position of the valve 22 based on the condition of the wellbore 14 and/or the surface.

To this end, the transmitter subsystem 38 may be any electronic data processing system that can be used to carry out various functions of the systems and methods described herein. For example, the transmitter subsystem 38 may include a processor 40 which may execute instructions stored in memory 42 and/or storage 44. As such, the memory 42 and/or the storage 44 of the transmitter subsystem 38 may be any suitable article of manufacture that can store the instructions. In some embodiments, the memory 42 is a tangible, non-transitory, machine-readable-medium that may store machine-readable instructions for the processor 40 to execute. The memory 42 may include ROM, flash memory, a hard drive, or any other suitable optical, magnetic, or solid-state storage medium, or a combination thereof. The memory 42 may store data, instructions, and any other suitable data. Additionally, the transmitter subsystem 38 may include an input/output (I/O) port 46, which may include interfaces coupled to various components such as input devices (e.g., keyboard, mouse), input/output (I/O) modules, sensors (e.g., surface sensors and/or downhole sensors), and the like. For example, the I/O port 46 may include a display (e.g., an electronic display) that may provide a visualization, a well log, or other operating parameters of the geological formation 16, the wellbore 14, or the surface to an operator, for example. In this embodiment, the transmitter subsystem 38 (e.g., data processing system) has been represented at the well site. However, all or part of the transmitter subsystem 38 (e.g., all or part of the processor, the display, the memory, etc.) may be situated remotely from the well site and configured to communicate with the well site via a network connection. It should be noted that, at least in some instances, all or part of the data processing system may be cloud-based.

Figure 2:
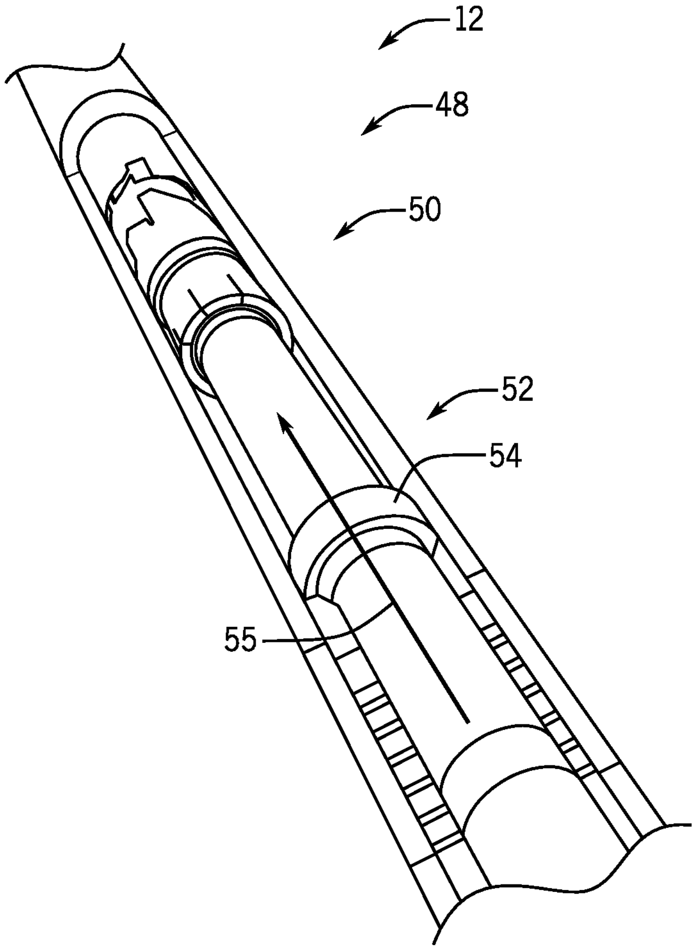
FIG. 2 is a perspective view of an embodiment of a downhole tool having a smart carbon coating.
Figure 3:
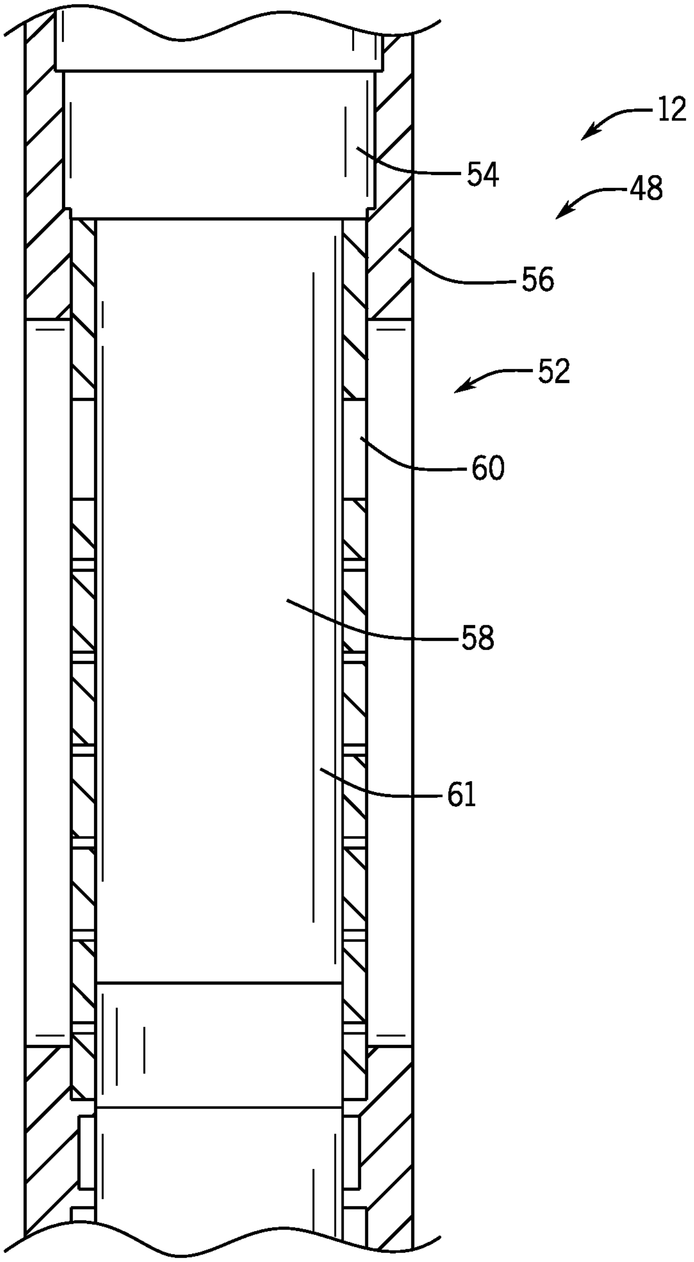
FIG. 3 is a cross-sectional side view of an embodiment of the downhole tool of FIG. 2.

As discussed herein, a smart carbon coating having one or more carbon rich layers may be applied to one or more surfaces of the downhole components to reduce, block, or generally inhibit the precipitation of scale onto surfaces of the downhole components, thereby reducing the possibility of blockage of fluid flow or the improper actuation of a mechanical component. Furthermore, the smart carbon coating may have improved mechanical resistance as compared to a substrate (e.g., a substrate of a downhole component), and thus the smart carbon coating may improve the longevity of the substrate. FIGS. 2 and 3 show examples of a downhole component to illustrate where it may be desirable to provide, apply, or deposit, the disclosed carbon rich layer.

FIG. 2 is a perspective view of an embodiment of the closure device 12, including a flow control valve 48, as an example of a downhole component having the disclosed carbon rich layer. The illustrated embodiment of the flow control valve 48 includes an indexer section 50 and a choke section 52. Additionally, the illustrated embodiment of the flow control valve 48 includes a collet 54 disposed on the choke section 52 that may secure or maintain a position of the choke section 52, such as by blocking longitudinal movement (e.g., along the axis 55) of the choke within the closure device 12. The smart carbon coating may be applied to any internal and external surfaces of the closing devices 12, such as along an interior flow path through the flow control valve 48.

FIG. 3 is a cross-sectional view of the choke section 52 of the flow control valve 48 of FIG. 2. The choke section 52 includes a choke housing 56 that at least partially surrounds a piston 58 and controls longitudinal movement of the piston 58. In general, the smart carbon coating may be applied on one or more surfaces of the flow control valve 48, such as along an inner surface 60 of the choke housing 56, an outer surface 61 of the piston 58, an inner surface of the collet 54, and inner or outer surfaces (not shown) of the indexer section 50.

It should be noted that the above discussions of FIGS. 1-3 regarding suitable locations where the smart carbon coating may be applied is meant to be non-limiting. In some embodiments, the smart carbon coating may be applied to a surface of a substrate that may be exposed to corrosive fluids, abrasive fluids, and/or scale-forming fluids, whether flowing in laminar or turbulent regimes, or the contrary stagnant. In some embodiments, the smart carbon coating may be applied to a surface of a substrate that may be exposed to corrosive fluids, erosive fluids, or other fluids that may include particulate that may cause mechanical abrasion to the substrate. In some embodiments, the substrate may be a downhole component that facilitates the regulation of flow to or from a geological formation, such as sliding sleeves, chokes, ball valves, and flapper valves. In some embodiments, the substrate may be a pressurized downhole component under at least 50 psi, at least 200 psi, at least 500 psi of pressure, 1000 psi of pressure, 2000 psi of pressure, or greater than 2000 psi of pressure (e.g., 5,000 psi or higher). In some embodiments, the substrate may be a surface (e.g., an inner surface and/or an outer surface) of a packer or a valve that is exposed to scale-forming fluids (e.g., carbonates, sulfates, silicates, sulfides, wax, asphaltene). It is presently recognized that it may be advantageous to apply the smart carbon coating on inner and/or outer surfaces of downhole components (e.g., the collet 54, the choke housing 56, the piston 58), wherein the downhole components may rely on electrical actuation as compared to hydraulic pressure actuation. For example, downhole components that are electrically actuated (e.g., having flow regulation systems that are actuated electrically) may be more susceptible to reduced efficiency of operation due to scale build up as compared to downhole components that are actuated via hydraulic pressure. Accordingly, with the progressive sensing of scale deposits, the disclosed smart carbon coating may improve the reliability of electrical actuation of downhole components, such as valves.

Furthermore, in embodiments where the disclosed smart carbon coating is applied onto a surface of a piston, it should be noted that the smart carbon coating may be configured to provide a relatively low friction coefficient under certain conditions, such as dry and normally unlubricated, or conversely lubricated conditions. For example, the smart carbon coating may be deposited on opposing surfaces (e.g., opposing contacting surfaces) or an entire circumference of multiple parts of the downhole component (e.g., a first part such as a piston and a second part such as a shaft including the piston). Additionally, the carbon rich layer may have a coefficient of friction less than approximately 0.30, 0.25, 0.20, 0.15, 0,10, or 0.05 against a metal under dry conditions, such as alloys of iron (steels, stainless steels, cast irons), nickel (superalloys), titanium, among others. Example alloys that may be used in accordance with the disclose techniques are included in certain standards such as ISO 15156, certain stainless steels, among martensitic stainless steels (e.g., 13Cr, modified 13Cr), duplex and superduplex stainless steels (22Cr, 25Cr) and nickel-based alloys such as Alloy 925, Alloy 718, among others. In certain applications, a polymer composite material that is non-interfering with downhole measurements; in others, a carbide component may be utilized to mitigate erosion. When applied to these components, the smart carbon coating may mitigate, prevent, or reduce scale formation as well as not reduce efficiency of operation of components that may be partially in contact during operation. Additionally, because of its ability to sense, the smart carbon coating may be able to detect a circumstance that would normally precede a failure, and as such prevent a failure from occurring.

Figure 4:
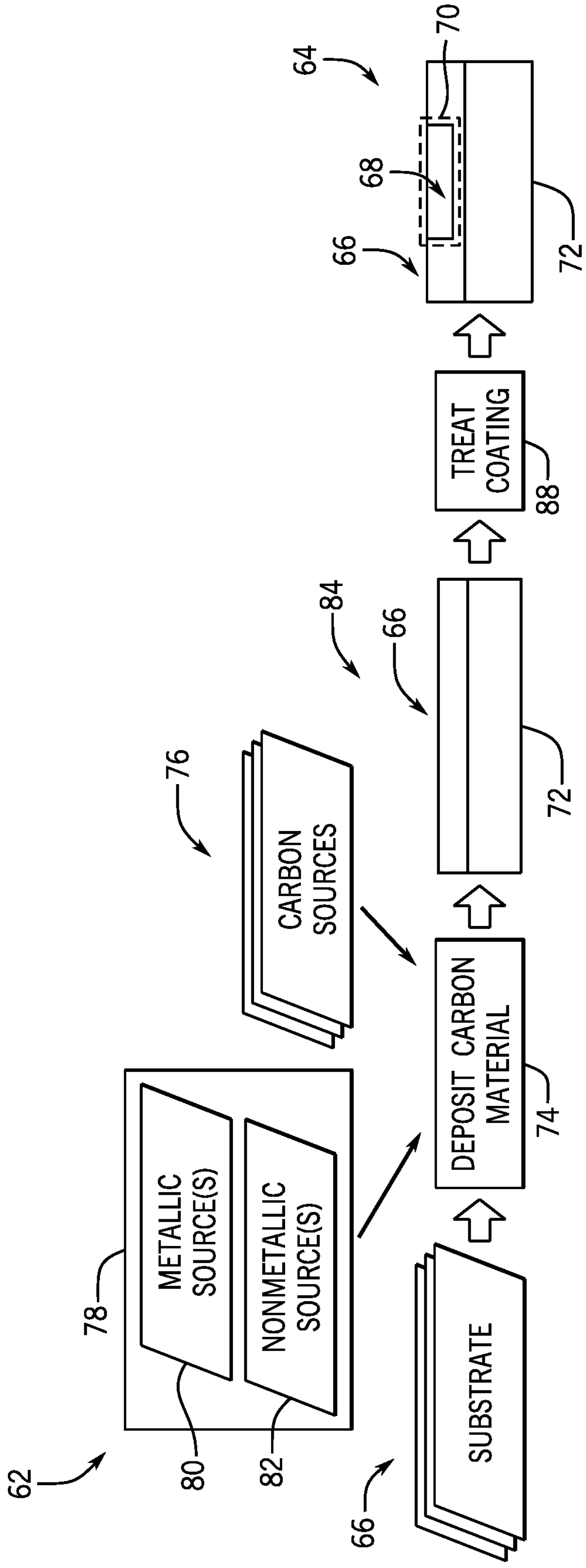
FIG. 4 is a flow diagram of an embodiment of a process for generating the smart carbon coating.

FIG. 4 is a flow diagram of an embodiment of a process 62 for producing a smart carbon coating 64 having one or more carbon rich layers 66 that include a treated carbon region 68 on a substrate 72 of a component (e.g., a downhole component). As generally described herein, the treated carbon region 68 (e.g., electrically active carbon region) includes one or more electrically conductive carbon materials 70. For example, the treated carbon region 68 may include one or more layers of electrically conductive carbon material 70 and/or an electrically conductive pattern (e.g., electric circuit) including the electrically conductive carbon materials 70. In some embodiments, the smart carbon coating 64 may be applied to the inside or outside of the substrate 72, thereby improving the mechanical resistance of the substrate 72 and/or for instance helping to reduce the possibility of scale formation on the substrate 72 of the component and to provide a sufficiently low coefficient of friction on the surface of the component to maintain acceptable efficiency.

At block 74, the process 62 includes depositing a carbon source 76 and one or more additional chemical components 78 (e.g., metallic sources 80 and/or non-metallic sources 82) onto the substrate 72 (e.g., the downhole component, such as those described with respect to FIGS. 1-3), thereby generating a coating 84 having a carbon rich layer 66. In general, the carbon source 76 and the additional chemical components 78 may be deposited via any suitable technique for producing a film or layer. For example, the carbon source 76 and the additional chemical components may be deposited onto the substrate using chemical vapor deposition (CVD), physical vapor deposition (PVD), plasma-assisted/plasma-enhanced CVD (PACVD, PECVD), plasma-based ion implantation and deposition (PBII&D), ionized evaporation (IE), sputtering (SP), and other similar processes producing DLCs or categorized under these designations, including hollow cathode plasma ion immersion process. In any case, the deposited carbon source 76 and the one or more additional chemical components 78 may form an amorphous and/or crystalline carbon on the surface of the substrate 72.

The substrate 72 may be part of a downhole component, such as a valve (e.g., ball valve, gate valve, or flapper valve), a packer, sliding sleeves, and a choke, as discussed with respect to FIGS. 1-3. For example, the substrate 72 may be a substantially cylindrical component having a length between 100 mm and 2 m, an inner diameter between 10 mm and 500 mm, and a thickness between 3 mm and 75 mm. In some embodiments, the substrate may be a component produced by an additive manufacturing process and may include a combination of materials (e.g., as discussed below in more details), including being functionally graded itself. In certain embodiments, the substrate 72 may be at least partially or entirely made of a polymer, a polymer composite, a metallized polymeric composite, and/or even an elastomeric component. In some embodiments, the substrate 72 may include one or more metals. For example, the substrate 72 may be at least partially or entirely made of a ferrous-based alloy, a nickel-based alloy, a cobalt-based alloy, a copper-based alloy, an aluminum-based alloy, or a magnesium based-alloy.

The carbon source 76 is a source including the carbon element and delivering this carbon element to one or more substrates. For example, the carbon source 76 may be a hydrocarbon gas such as methane, ethane, and/or ethyne, and/or a metal carbonyl. To produce elemental carbon that would deposit rapidly onto a target substrate, the carbon source gas may be ignited by an AC voltage, which may cause carbon and hydrogen atoms to recombine as a dense carbon rich layer onto the substrate.

The additional chemical components 78 generally include silicon and metallic sources 80 (e.g., transition metal sources, main-group metal sources) and nonmetallic sources 82. For example, the metallic sources 80 may include tungsten, titanium, chromium, nickel, iron, and/or cobalt, such as corresponding metal carbonyls, metal hydrides, metal halides, among others. The nonmetallic sources 82 may include silicon, oxygen, nitrogen, fluorine, and/or chlorine, such as silanes, metal halides, fluorine gas, nitrogen gas, ammonia, and alkylamines.

At block 88, the process 62 includes treating the coating 84 (including the carbon rich layers 66) with radiation or a focused energy source. In general, treating the coating 84 with radiation may include providing a suitable exposure of the coating 84 with a laser, thereby modifying or altering at least a portion of the carbon rich layers 66 to produce an induced pattern or circuitry including electrically conductive carbon materials 70. As referred to herein, an "induced circuitry" or "an induced pattern" refers to circuitry or pattern formed due to a modification (e.g., a chemical modification resulting from laser treatment) of a material. In general, the suitable exposure may include illuminating the coating 84 at certain exposure parameters, such as a particular power of the laser (e.g., between 5 Watts (W) and 10 W, between 10 W and 15 W, between 15 W and 20 W, between 20 W and 25 W, or greater than 25 W, a wavelength of the emission of the laser within a suitable wavelength range (e.g., between 180 and 400 nm, between 400 and 700 nm, between 700 nm and 1100 nm), a pulse duration of width (e.g., between 1 ms and 10 ms, between 1 ns and 10 ns, between 5 fs and 100 ps) and scan rate between 1 mm/s and 6000 mm/s. In any case, providing the suitable exposure of the coating 84 with the laser may generate a smart carbon coating 64 having a carbon rich layer 66 and an electrically conductive carbon material 70. Focusing the laser beam on the surface of the carbon rich layers 66 may form a pattern (e.g., an electric circuit) of the electrically conductive carbon by modifying the carbon content, thereby producing a different carbon species. It is presently recognized that tuning the exposure parameters may enable tuning of the carbon content and/or the thickness of the electrically conductive carbon material 70.

In some embodiments, treating the coating, at block 88, may include creating one or more interconnects between a conductive pattern, engraved circuitry, or printed circuitry by depositing a conductive metal (e.g., copper, gold, silver) and/or applying an electrically conductive anchoring element, thereby forming a material acting as a pad. At least in some instances, creating the interconnects and treating the coating may be performed in a single similar chamber, such as a plasma vapor deposition (PVD) chamber, a chemical vapor deposition (CVD), or a plasma-assisted or enhanced chemical vapor deposition (PACVD, PECVD) chamber. Moreover, one or more additional layers of the carbon rich layer 66 may be applied to the smart coating 64, thereby forming a carbon rich layer 66 on top of the treated carbon region 68.

In certain embodiments, the carbon rich layer 66 includes one or more regions, areas, or locations having carbon content with a particular amount of (e.g., or otherwise being characterized) $sp^2$ carbon and/or $sp^3$ carbon. Furthermore, the carbon rich layer may include a suitable amount of $sp^2$ and $sp^3$ carbon to produce desired combinations of properties among, surface hardness, friction coefficient, contact angles, all generally having positive impacts for reducing a likelihood of scale precipitation (e.g., scale formation) and/or other deterioration on the surface of a coating. Carbon is stabilized in various multi-atomic structures with diverse atomic arrangements or configurations referred as allotropes: these includes amorphous carbon (a-C), graphite (with $sp^2$ configuration) and tetrahedral amorphous carbon (ta-C) or defected diamond (with $sp^3$ configuration). Carbon-rich layers include these allotropes in various proportions, among carbon and non-carbon phases. The treated carbon rich portion generally includes electrically conductive carbon materials formed by treating the carbon rich layer with a focused energy source such as an illumination source such as a laser. In some embodiments, the carbon rich layer 66 and/or the treated carbon region 68 may include one or more dispersed phases that include mixtures of carbon with elements from the one or more additional chemical components 78, such as metal carbides. In some embodiments, the carbon rich layer 66 and/or the treated carbon region 68 may include combinations of different elements from the additional chemical components 78, such as metal chalcogenides, as discussed in further detail herein.

The carbon rich layer 66 may include a suitable amount of $sp^2$ and $sp^3$ carbon to produce desired combinations of mechanical and/or electrical properties. In general, carbon is stabilized in various multi-atomic structures with diverse atomic arrangements or configurations referred as allotropes: these includes amorphous carbon (a-C), graphite (with $sp^2$ configuration) and tetrahedral amorphous carbon (ta-C) or defected diamond (with $sp^3$ configuration). Carbon-rich layers include these allotropes in various proportions, among carbon and non-carbon phases. In some embodiments, the carbon rich layer 66 may include diamond-like carbon. For example, the carbon rich layer 66 may have greater than 30% $sp^3$ carbon, greater than 50% $sp^3$ carbon, greater than 70% $sp^3$ carbon, greater than 90% $sp^3$ carbon.

Further, the carbon rich layer 66 may include a total thickness between 0.5 μm and 30 μm. For example, the total thickness of the carbon rich layer 66 may be between 50 μm and 30 μm, between 0.75 μm and 15 μm, between 1.0 μm and 5.0 μm, or between 1.25 μm and 2.5 μm. In certain embodiments, the total thickness of the carbon rich layer 66 may include both a thickness of one or more carbon rich layers and a thickness of one or more other layers deposited on the substrate 72, such as a top surface layer, a buffer layer (i.e., a layer introduced to accommodate (e.g., increase the binding strength of) the carbon-rich layer on the substrate), and a dispersed phase layer. For example, the carbon rich layer 66 may include a plurality of layers, which may include carbon rich layers and optionally non-carbon rich layers, collectively defining a total thickness of the carbon rich layer 66. Buffer layers may include metallic materials, and may also comprise transition-metals applied by PVD, CVD, PACVD, PECVD, plating, thermal spray or others. The buffer layer may also include non-metallic materials, including polymeric materials and ceramic materials. In order to accommodate a carbon-rich layer onto a surface of the substrate, these layers may include carbon-containing materials, such as tungsten carbide and fluoropolymer.

As discussed herein, the carbon rich layer 66 includes a treated carbon region 68 that is an electrically conductive carbon region formed of electrically conductive carbon materials 70. In general, the treated carbon region 68 is more electrically conductive (e.g., has a lower sheet electrical resistance) than the untreated portions of the carbon rich layer 66. For example, the sheet electrical resistance of the carbon rich layers 66 may be more than 100 times (i.e., 2 orders of magnitude), more than 250 times, more than 500 times, or more than 1000 times (i.e., 3 orders of magnitude), than the sheet electrical resistance of the treated carbon region 68. Put differently, the sheet electrical resistance of the treated carbon region 68 may be less than $1/100^{th}$, than that of the sheet electrical resistance of the carbon rich layers 66. Additionally, the treated carbon region 68 may have a generally higher amount of $sp^2$ carbon. For example, the treated carbon region 68 may have increased $sp^2$ carbon (e.g., greater than 30%, greater than 40%, greater than 50%), a relatively higher $sp^2/sp^3$ ratio (e.g., greater than 0.5, greater than 1.0, greater than 1.5), a relatively low sheet electrical resistance (e.g., less than 1000Ω per sq.), or a combination thereof, as compared to the carbon rich layers 66 that are untreated.

The treated carbon rich portion 68 may include an electrically conductive pattern (e.g., electric circuit) that includes the electrically conductive carbon materials 70. The electrically conductive pattern may be utilized as a sensing substrate that is capable of detection a presence of fluids on the surface of the smart carbon rich coating, such as an electric circuit (e.g., printed circuitry) as described in more detail with respect to FIGS. 6-9. In this way, the smart carbon coating 64 may reduce or prevent mechanical abrasion to a downhole component (i.e., due to the mechanical resistance of the carbon rich layer) while also enabling detection of exposure of the downhole components to force, pressure, stress, displacement, strain, or presence of fluids that product a mechanical and/or chemical change to the treated carbon region 68 that are detectable via measuring electrical properties of the treated carbon region 68.

In some embodiments, the smart carbon coating 64 and/or treated carbon region 68 may include a suitable amount of the electrically conductive carbon material 70 such that the sheet electrical resistance (Rs) in Ohms per square (Ω per sq.) of the smart carbon coating 64 is less than 1000Ω per sq. For example, the suitable amount of the electrically conductive carbon material 70 may be such that the Rs of the smart carbon coating 64 is between approximately 10 to 1000Ω per sq., 20Ω per sq. to 500Ω per sq., 30Ω per sq. to 250Ω per sq., 40Ω per sq. to 200Ω per sq., 50-150Ω per sq. In some embodiments, the smart carbon coating 64 may include a suitable amount of the electrically conductive carbon material 70 such that the carbon content of the smart carbon coating 64 is greater than 30% $sp^2$ carbon (e.g., amount of $sp^2$ carbon/(amount of $sp^2$ carbon+amount of $sp^3$ carbon), greater than 40% $sp^2$ carbon, greater than 50% $sp^2$ carbon, greater than 60% $sp^2$ carbon, greater than 70% $sp^2$ carbon, greater than 80% $sp^2$ carbon. In some embodiments, the smart carbon coating 64 may include a suitable amount of electrically conductive carbon material 70 such that the $sp^2/sp^3$ ratio of the smart coating is greater than 0.5, greater than 1.0, or greater than 1.5. For example, the smart carbon coating 64 may include a suitable amount of electrically conductive carbon material 70 such that the $sp^2/sp^3$ ratio of the smart coating is between 0.5 to 2.0, between 0.75 to 1.5, or between 1.0 to 1.25.

The electrically conductive carbon material 70 is generally a modified portion of the material within the carbon rich layer 66. In some embodiments, the electrically conductive carbon materials may include graphene, graphite, and other types of electrically conductive carbon materials. In some instances, the treated carbon region 68 may include a portion of the electrically conductive carbon material 70, such as one or more underlying layers of a less conductive carbon material or inventing portions of the less conductive carbon material in between any patterns (e.g., patterns formed of the electrically conductive carbon material 70, such as an electric circuit, a sensing circuit, and the like, as described with respect to FIGS. 6-9) included in the treated carbon region 68. That is, treated carbon region 68 may include an area of a surface of the smart carbon coating 64 where 20% of the area includes the electrically conductive carbon material 70 and 80% of the area is the untransformed, carbon rich layer. It should be noted that the treated carbon region 68 may include any suitable percent area and/or volume of the electrically conductive carbon material 70, such that the treated carbon region 68 is conductive (e.g., the treated carbon region 68 and/or the smart carbon coating 64 having a sheet electrical resistance that is less than 2000Ω per sq. or less than 1000Ω per sq.), as described above. For example, the treated carbon region 68 may include 0.01% by area or volume of the electrically conductive carbon material 70 and 99.99% by area of volume of the carbon rich layer 66 (e.g., the untreated carbon), 0.1% by area or volume of the electrically conductive carbon material 70 and 99.9% by area of volume of the carbon rich layer 66, 1% by area or volume of the electrically conductive carbon material 70 and 99% by area of volume of the carbon rich layer 66, 10% by area or volume of the electrically conductive carbon material 70 and 90% by area of volume of the carbon rich layer 66, among others.

Figure 5:
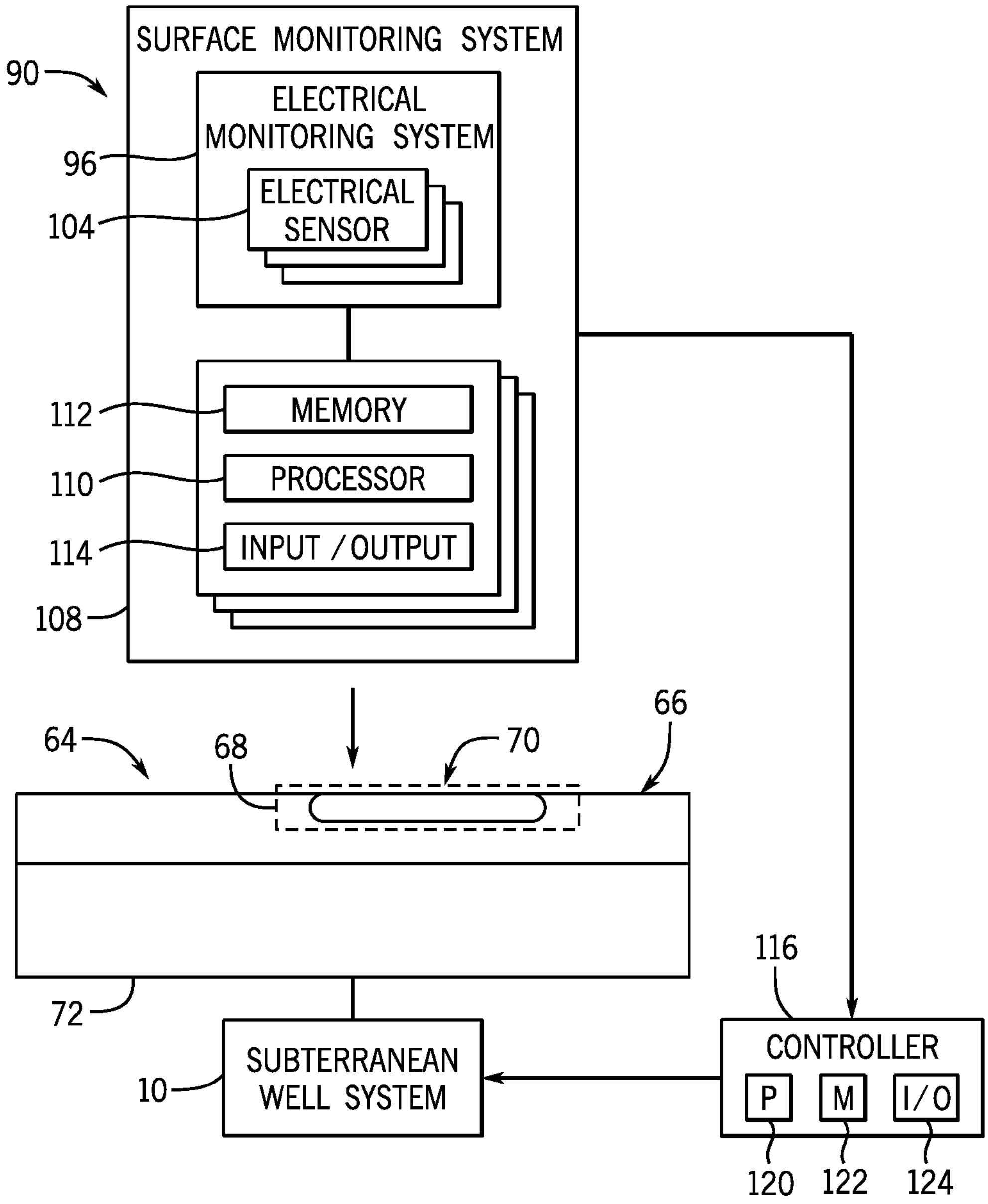
FIG. 5 is a block diagram of an embodiment of a smart carbon coating monitoring system.

To illustrate how exposure to fluids, materials (e.g., scale), or stress applied to, reacting with, or otherwise in the presence of the smart carbon coating 64 may be detected (e.g., corrosive fluids, scale-forming fluids, abrasive fluids, and the like), FIG. 5 is a diagram of an embodiment of a surface monitoring system 90 configured to detect a change in the electrical properties of the smart carbon coating 64 that result from a chemical and/or mechanical change to the treated carbon region 68. For example, the surface monitoring system 90 may include one or more electrical monitoring systems 96.

As discussed with respect to FIG. 4, the smart carbon coating 64 is generally a material coating composed of a carbon rich layer 66 having a treated carbon region 68 that includes electrically conductive carbon materials 70. In general, and as discussed in more detail herein, the electrically conductive carbon materials 70 of the treated carbon region 68 are capable of producing a detectable, measurable, or observable change in the electrical property of at least a portion of the surface or volume of the smart carbon coating 64 due to certain downhole conditions or external factors, such as force, stress, pressure, displacement, strain, water, humidity, exposure to one or more fluids that may interact with the treated carbon region 68 (i.e., the electrically conductive carbon material 70 and/or the carbon rich layer 66), such as water, carbon dioxide, hydrogen sulfide, hydrogen, an acid, or a base, and/or build-up of materials onto a surface of a downhole component coated with the smart carbon coating 64. As referred to herein, a "change in an electrical property" may include a change in an impedance of a material, which may be the results of a change in an inductance, a capacitance, and a resistance (e.g., a sheet electrical resistance) under a varying electrical potential or current.

The electrical monitoring system 96 generally includes one or more electrical sensors 104 that measure or detect the change in the electrical properties of the smart carbon coating 64 due to changes on a surface of the smart coating 64 (e.g., the electrically active carbon region 68 and/or the carbon rich layer 66). In some embodiments, the electrical sensors 104 may include electrical property sensors, multimeters, and other suitable devices capable of measuring a resistance of the smart coating 64, a change in current flowing through the smart carbon coating 64, a change in the dielectric constant of the smart carbon coating 64, and the like, that are indicative of the composition of the smart carbon coating 64. For example, the electrical monitoring system 96 may detect the change in the electrical properties of the smart carbon coating 64 due to a displacement, an elongation, a strain, a force, a stress, a pressure, a surface chemistry including environmental fluid, humidity, contaminants and combinations of such conditions, of the smart carbon coating 64. In general, the electrical monitoring system 96 may be capable detecting such changes inside (e.g., on an interior surface) or outside (e.g., on an exterior surface) of the downhole component that is coated with the smart carbon coating 64.

In any case, the sensor data (e.g., generated by the pressure sensor(s) 102 and electrical sensors 104) may be output to a computing device 108 (e.g., machine) having a processor 110, which may execute instructions stored in memory 112 and/or storage media, or based on inputs provided from a user via the input/output (I/O) device 114. The memory 112 and/or the storage media may be read-only memory (ROM), random-access memory (RAM), flash memory, an optical storage medium, or a hard disk drive, to name but a few examples. For example, in operation, the processor 110 may receive sensor data and/or the visual data, determine that the electrical properties of the smart carbon coating 64 have changed above a threshold indicating a potential of exposure to stress, strain, certain fluids (e.g., water and gases such as carbon dioxide, hydrogen sulfide, hydrogen, any combination thereof, and others), or scale deposition, and send an alert or suitable control signals to take a corrective action.

In some embodiments, the processor 110 of the surface monitoring system 90 may send suitable control signals to a controller 116 (e.g., an external controller) of the subterranean well system 10. In general, the subterranean well system 10 may include machine components or downhole components that control one or more oil and gas operations, as described in FIG. 1. For example, the subterranean well system 10 may include a well closure system having wellhead, a casing head, a tubing head, a frac head, a Christmas tree having various valves and flow control equipment, a blowout preventer, tubing, a chemical injection system, or any combination thereof. The subterranean well system 10 may include suitable components (e.g., valves, packers, pumps, wellheads, tubes, pipes, couplings, and other components along downhole tubulars and downhole jewelry) for performing well closure operations, as described herein. As such, the suitable control signal may cause the transmitter subsystem 38 to transmit a control signal that causes a valve 22 to modify a position (e.g., open or close), a drill to halt operation, and the like. In some embodiments, the suitable control signal may generate an alert (e.g., via a computing device of a driver or other user) indicating one or more surfaces coated with the smart carbon coating 64 may have been exposed to one or more fluids, and thus, may need to be replaced or receive maintenance.

In this way, by enabling the surface monitoring system 90 to monitor and control operation of a subterranean well system 10, the surface monitoring system 90 may be utilized in maintenance or machine health monitoring operations. That is, the surface monitoring system 90 may be capable of receiving data (e.g., the sensor data, the visual data, or both), making a determination about a state or condition of the smart carbon coating 64 (e.g., whether the smart carbon coating 64 has been exposed to an amount of water and other fluids above a threshold), and outputting alerts and control signals that may modify the operation of the subterranean well system 10, such as alerting a user that a component including the smart carbon coating 64 needs to be replaced, halting operations, adjusting a fluid flow via one or more valves, and the like.

The controller 116 associated with the subterranean well system 10 includes a processor 120, which may execute instructions stored in memory 122 and/or storage media 44, or based on inputs provided from a user via the input/output (I/O) device 124. The processor 120 may execute instructions stored in memory 122 and/or storage media, or based on inputs provided from a user via the input/output (I/O) device 124. The memory 122 and/or the storage media 44 may be read-only memory (ROM), random-access memory (RAM), flash memory, an optical storage medium, or a hard disk drive, to name but a few examples. At least in some instances, the processor 110 of the computing device 108 of the surface monitoring system 90 may send the control signals directly to the subterranean well system 10 instead of sending control signals to an external processor (e.g., the processor 120 of the controller 116).

Figure 6:
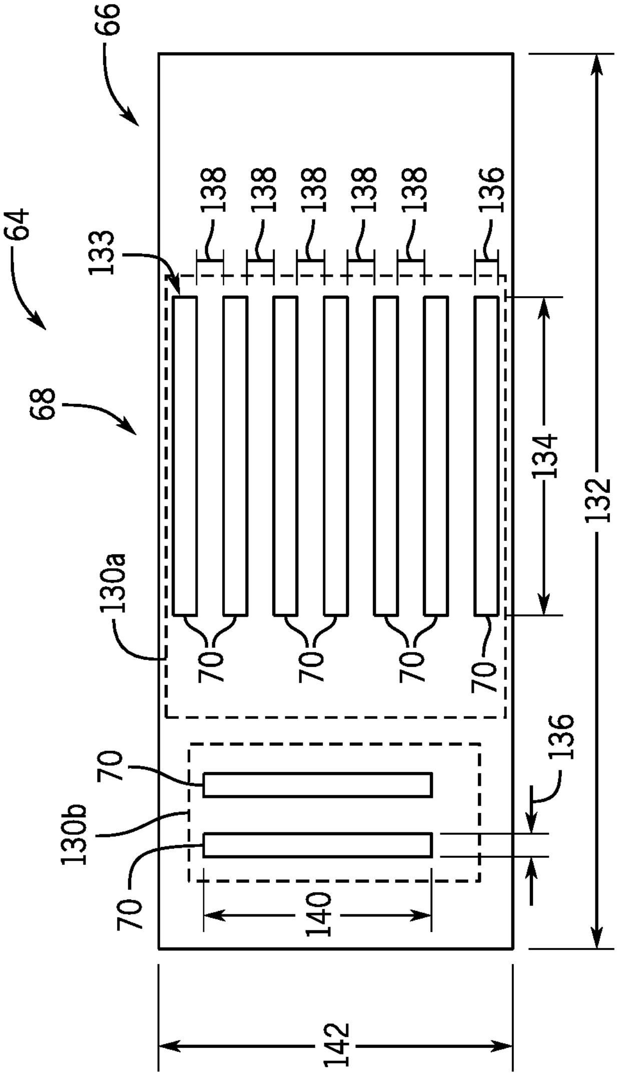
FIGS. 6-9 are perspective views of embodiments of the smart carbon coating on a component.

To illustrate one embodiment of the treated carbon region 68 of the smart carbon coating 64, FIG. 6 is a schematic top view of an embodiment of the smart carbon coating 64 having the carbon rich layer 66 deposited on the substrate 72, wherein the treated carbon region 68 includes multiple electrically conductive carbon material 70. In the illustrated embodiment, the smart carbon coating 64 includes a first set of electrically conductive carbon material 70 that form a first pattern (e.g., a first array, a first electric circuit,) 130*a* and a second set of electrically conductive carbon material 70 that form a second pattern 130*b* (e.g. a second array). The first pattern 130*a* of electrically conductive carbon material 70 includes multiple sections or strips 133 of the electrically conductive carbon material 70 arranged along (e.g., parallel with) a first axis 132 (e.g., longitudinal axis). In the illustrated embodiment, each strip 133 of the electrically conductive carbon material 70 has a length 134 and a width 136. Each strip 133 in the first pattern 130*a* may be a linear strip, a curved strip, a wavy strip, a multi-angled or zigzagging strip, or any suitable shape. For example, each strip 133 in the first pattern 130*a* may extend linearly along the first axis 132, wherein the strip 133 has a uniform width 136 along an entirety of the length 134. Additionally, adjacent strips 133 of the electrically conductive carbon material 70 are separated by a distance 138 (e.g., lateral distance in the direction of a second axis 142). It should be noted that while only seven strips 133 of the electrically conductive carbon material 70 are shown within the first pattern 130*a*, the smart carbon coating 64 may include two, three, four, five, six, eight, nine, ten, or more strips 133 of the electrically conductive carbon material 70, each having a respective length 134 and width 136.

Additionally, the second pattern 130*b* of electrically conductive carbon material 70 includes multiple sections or strips 133 of the electrically conductive carbon material 70 arranged along (e.g., parallel with) the second axis 142 (e.g., transverse axis). For example, the first and second axes 132 and 142 may be oriented crosswise (e.g., perpendicular or between 45 to 90 degrees) relative to one another. In the illustrated embodiment, each strip 133 of the electrically conductive carbon material 70 has a length 134 and a width 136. Similar to the first pattern 130*a*, each strip 133 in the second pattern 130*b* may be a linear strip, a curved strip, a wavy strip, a multi-angled or zigzagging strip, or any suitable shape. For example, each strip 133 in the second pattern 130*b* may extend linearly along the second axis 142, wherein the strip 133 has a uniform width 136 along an entirety of the length 134. Additionally, adjacent strips 133 of the electrically conductive carbon material 70 are separated by a distance 140 (e.g., lateral distance in the direction of first axis 132). It should be noted that while only two strips 133 of the electrically conductive carbon material 70 are shown within the second pattern 130*b*, the smart carbon coating 64 may include three, four, five, six, seven, eight, nine, ten, or more strips 133 of the electrically conductive carbon material 70, each having a respective length 134 and width 136. Furthermore, while only two patterns 130 of the electrically conductive carbon material 70 are shown in FIG. 6, the smart carbon coating 64 may include one, three, four, five, six, seven, eight, nine, ten, or more patterns 130. In general, the smart carbon coating 64 may be conductive (i.e., has a first sheet resistance) as a result of forming at least one of the patterns 130 and/or the electrically conductive carbon material 70. As such, if the smart carbon coating 64 is subjected to a fluid that induces a chemical change in the electrically conductive carbon 70, the first sheet resistance may increase or decrease to a second sheet resistance. As such, if a voltage is applied to a pad region such that an electrical current flows across the patterns 130, the electrical current may decrease or increase due to the chemical change in the electrically conductive carbon 70.

Figure 7:
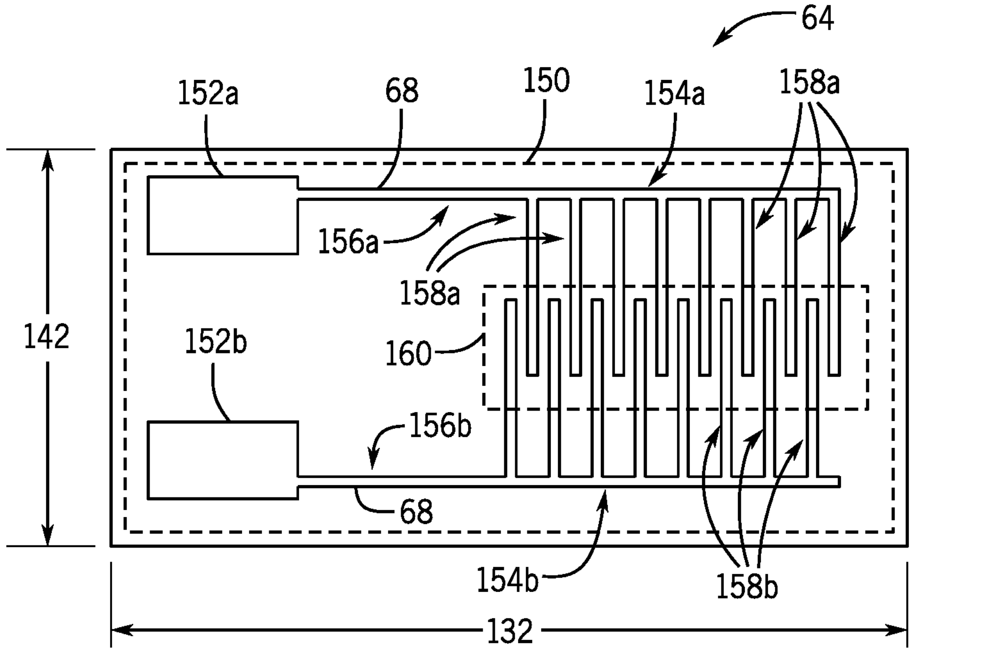

To illustrate another embodiment of the treated carbon region 68 of the smart carbon coating 64, FIG. 7 is a schematic top view of an embodiment of the smart carbon coating 64 having the carbon rich layer 66 deposited on the substrate 72. In the illustrated embodiment, the smart carbon coating 64 includes electrically conductive carbon material 70 that form a sensing pattern 150. The sensing pattern 150 generally includes pad regions 152*a* and 152*b* (e.g., collectively, 152) of the electrically conductive carbon material 70. Each pad region 152*a* and 152*b* may be a rectangular, circular, oval, or polygonal pad region. The pad region 152*a* is physically and electrically coupled to a first sensing array pattern region 154*a* (e.g., circuit portion) of the electrically conductive carbon material 70. The first sensing array pattern region 154*a* includes a first length 156*a* (e.g., section or strip) of the electrically conductive carbon material 70 that extends along the first axis 132 and includes multiple branches 158*a* (e.g., sections or strips) that extend along the second axis 142. As illustrated, the branches 158*a* are substantially parallel to each other and the second axis 142. The pad region 152*a* and the first sensing array pattern region 154*a* (e.g., including the first length 156*a* and the branches 158*a*) are formed of electrically conductive carbon material 70 and, as such, form a continuous electrically conductive pattern.

The pad region 152*b* is physically and electrically coupled to a second sensing array pattern region 154*b* of the electrically conductive carbon material 70. The second sensing array pattern region 154*b* includes a second length 156*b* (e.g., section or strip) of the electrically conductive carbon material 70 that extends along the first axis 132 and includes multiple branches 158*b* that extend along the second axis 142. As illustrated, the branches 158*b* are substantially parallel to each other and the second axis 142. The pad region 152*b* and the second sensing array pattern region 154*b* (e.g., including the second length 156*b* and the branches 158*b*) are formed of electrically conductive carbon material and, as such, form a continuous electrically conductive pattern.

In the illustrated embodiment, the first sensing array pattern region 154*a* and the second sensing array pattern region 154*b* are not physically coupled to each other. Instead, and as illustrated, the first sensing array pattern region 154*a* and the second sensing array pattern region 154*b* are separated by intermediate portions of the carbon rich layer 66. As shown, the branches 158*a* and 158*b* form an overlapping pattern 160, where the branches 158*a* and 158*b* are separated by intermediate portions of the carbon rich layer 66 and overlap along the second axis 142. As illustrated, the overlapping pattern 160 has the branches 158*a* and 158*b* arranged in an alternating configuration, wherein one of the branches 158*a* extends along the second axis 142 between each adjacent pair of the branches 158*b*. In the illustrated embodiment, the overlapping pattern 160 has an alternating sequence of one branch 158*b*, one branch 158*a*, one branch 158*b*, one branch 158*a*, one branch 158*b*, one branch 158*a*, one branch 158*b*, one branch 158*a*, one branch 158*b*, one branch 158*a*, one branch 158*b*, one branch 158*a*, one branch 158*b*, one branch 158*a*, one branch 158*b*, and one branch 158*a*, wherein the branches 158*a* and 158*b* are parallel and overlap along the second axis 142. In general, the carbon rich layer 66 is generally less conductive than the electrically conductive carbon material 70. As such, if a voltage is applied to the pad region 152*a*, current may not flow between the first sensing array pattern region 154*a* and the second sensing array pattern region 154*b*. However, if a fluid that is more conductive than the carbon rich layer 66 is deposited onto the sensing pattern 150, current may flow between the first sensing array pattern region 154*a* and the second sensing array pattern region 154*b*. Accordingly, the sensing pattern 150 shown in FIG. 7 illustrates an arrangement of the electrically conductive carbon material 70 that may facilitate the detection of certain fluids (e.g., conductive fluids, such as water) onto the smart carbon coating 64.

Figure 8:
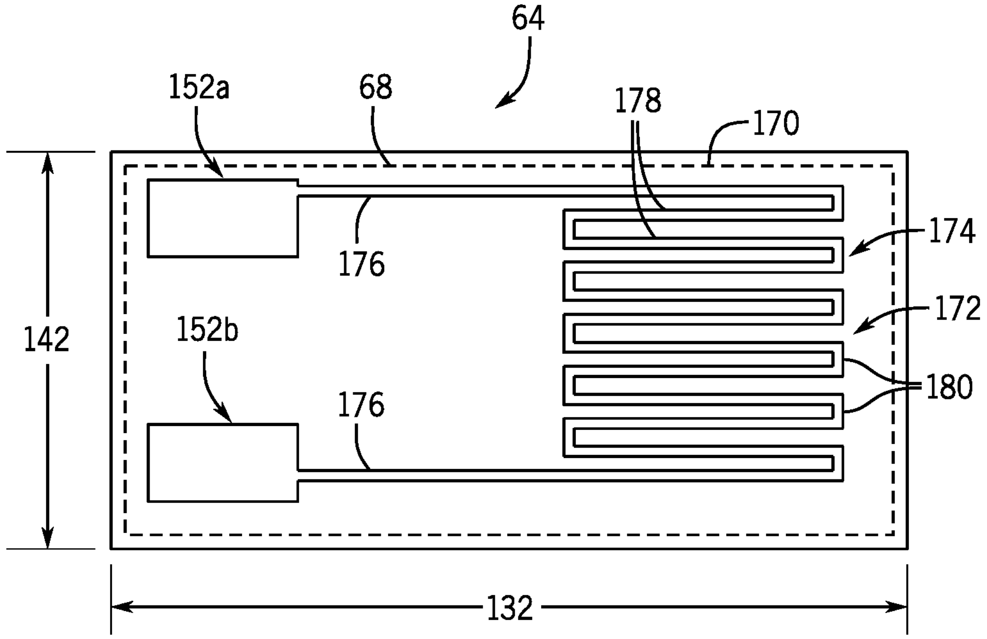

To illustrate another embodiment of the treated carbon region 68 of the smart carbon coating 64, FIG. 8 is a schematic top view of an embodiment of the smart carbon coating 64 that may be utilized for detecting mechanical strain applied to a downhole component coated with the smart carbon coating 64 (e.g., a strain applied along the first axis 132 and/or second axis 142. In the illustrated embodiment, the smart carbon coating 64 includes an electrically conductive pattern 170 of the electrically conductive carbon material 70 with pad regions 152*a* and 152*b* that are physically and electrically coupled via an intermediate or intervening region 172 of the electrically conductive carbon material 70. Each pad region 152*a* and 152*b* may be a rectangular, circular, oval, or polygonal pad region. In general, the intervening region 172 includes electrically conductive carbon material 70 forming a zigzagging or wave pattern 174 between adjacent connecting portions 176 (e.g., strips) coupled to the pad regions 152*a* and 152*b*. The connecting portions 176 extend along (e.g., parallel to) the first axis 132. The wave pattern 174 may be shaped as a square wave pattern having parallel sides 178 coupled together at flat peaks 180, which alternative between opposite ends of the parallel sides 178. The parallel sides 178 extend along the first axis 132, while the flat peaks 180 extend along the second axis 142. The electrically conductive pattern 170 of FIG. 8 may be utilized to detect strain or pressure applied to a downhole component coated with the smart carbon coating 64. In particular, a strain or force applied to the intervening region 172 may reduce the current flowing between the pad regions 152*a* and 152*b*. Accordingly, the electrically conductive pattern 170 shown in FIG. 8 illustrates an arrangement of the electrically conductive carbon material 70 that may facilitate the detection of mechanical strain applied to the smart carbon coating 64. That is, a mechanical strain imparted to the smart carbon coating 64 may cause a deformation, resulting in a modification (e.g., increase or decrease) to the length of the conductive path between the pad regions 152*a* and 152*b*. As such, if the length of the conductive path increases, then the sheet resistance of the smart carbon coating 64 may decrease. Alternatively, if the length of the conductive path decreases, then the sheet resistance of the smart carbon coating 64 may increase.

Figure 9:
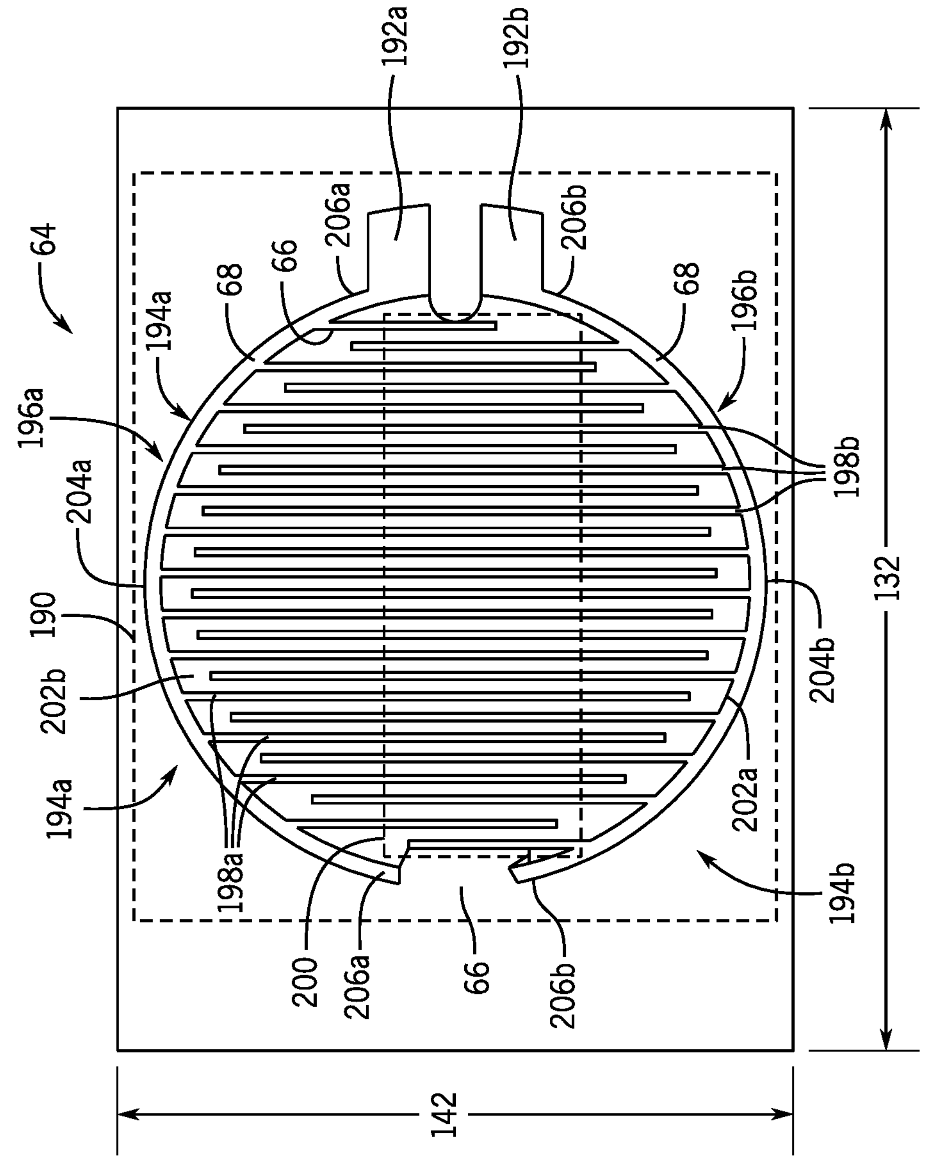

To illustrate another embodiment of the smart carbon coating 64, FIG. 9 is a schematic top view of an embodiment of the smart carbon coating 64 having the carbon rich layer 66 deposited on the substrate 72, wherein the treated carbon region 68 includes electrically conductive carbon material 70. In the illustrated embodiment, the treated carbon region 68 of the smart carbon coating 64 includes multiple sections or strips of the electrically conductive carbon material 70 arranged in a sensing pattern 190. The sensing pattern 190 generally includes pad regions 192*a* and 192*b* (e.g., collectively, 192) of the electrically conductive carbon material 70. Each pad region 192*a* and 192*b* may be a rectangular, circular, oval, or polygonal pad region The pad region 192*a* is physically and electrically coupled to a first sensing array pattern region 194*a* of the electrically conductive carbon material 70. The first sensing array pattern region 194*a* includes a first curved length 196*a* (e.g., strip) of the electrically conductive carbon material 70, wherein the first curved length 196*a* may define a U-shaped strip, a semi-circular strip, or an arcuate strip. The first curved length 196*a* generally extends in a direction along the first axis 132, while also curving away and toward the first axis 132 in a direction along the second axis 142. The first sensing array pattern region 194*a* also includes multiple branches 198*a* (e.g., sections or strips) coupled to the first curved length 196*a*, wherein the multiple branches 198*a* extend along the second axis 142 from different position of the first curved length 196*a* along the first axis 132. As illustrated, the branches 198*a* are substantially parallel to each other and the second axis 142. The pad region 192*a* and the first sensing array pattern region 194*a* (e.g., including the first curved length 196*a* and the branches 198*a*) are formed of electrically conductive carbon material 70 and, as such, form a continuous electrically conductive pattern.

In the illustrated embodiment, the pad region 192*b* is physically and electrically coupled to a second sensing array pattern region 194*b* of the electrically conductive carbon material 70. The second sensing array pattern region 194*b* includes a second curved length 196*b* (e.g., section or strip) of the electrically conductive carbon material 70 that extends along the first axis 132 and includes multiple branches 198*b* that extend along the second axis 142. The branches 198*b* are substantially parallel to each other and the second axis 142. The pad region 192*b* and the second sensing array pattern region 194*b* (e.g., including the second curved length 196*b* and the branches 198*b*) are formed of electrically conductive carbon material 70 and, as such, form a continuous electrically conductive pattern.

In the illustrated embodiment, the first sensing array pattern region 194*a* and the second sensing array pattern region 194*b* are not physically coupled to each other. Instead, and as illustrated, the first sensing array pattern region 194*a* and the second sensing array pattern region 194*b* are separated by intermediate portions of the carbon rich layer 66. Furthermore, as shown, the branches 198*a* and 198*b* form an overlapping pattern 200, where the branches 198*a* and 198*b* are separated by intermediate portions of the carbon rich layer 66 and overlap along the second axis 142. As illustrated, the overlapping pattern 200 has the branches 198*a* and 198*b* arranged in an alternating configuration, wherein one of the branches 198*a* extends along the second axis 142 between each adjacent pair of the branches 198*b*. In the illustrated embodiment, the overlapping pattern 200 has an alternating sequence of one branch 198*b*, one branch 198*a*, one branch 198*b*, one branch 198*a*, one branch 198*b*, one branch 198*a*, and so forth, wherein the branches 198*a* and 198*b* are parallel and overlap along the second axis 142. Additionally, each branch 198*a* coupled to the first curved length 196*a* extends toward without contacting the second curved length 196*b* (e.g., with a first spacing 202*a*), while each branch 198*b* coupled to the second curved length 196*b* extends toward without contacting the first curved length 196*a* (e.g., with a second spacing 202*b*). The spacing 202*a* and the spacing 202*b* may be the same or substantially the same for each of the branches 198*a* and 198*b*. Additionally, the branches 198*a* and 198*b* may vary in length along the second axis 142 depending on the position along the first and second curved lengths 196*a* and 196*b*, wherein the length of the branches 198*a* and 198*b* in middle portions 204*a* and 204*b* of the respective first and second curved lengths 196*a* and 196*b* is greater than the length of the branches 198*a* and 198*b* in end portions 206*a* and 206*b* of the respective first and second curved lengths 196*a* and 196*b*. In general, the carbon rich layer 66 is generally less conductive than the electrically conductive carbon material 70. As such, if a voltage is applied to the pad region 192*a*, current may not flow between the first sensing region 194*a* and the second sensing region 194*b*. However, if a fluid that is more conductive than the carbon rich layer 66 is deposited onto the sensing pattern 190, current may flow between the first sensing region 194*a* and the second sensing region 194*b*. Accordingly, the sensing pattern 190 shown in FIG. 9 illustrates an arrangement of the electrically conductive carbon material 70 that may facilitate the detection of certain fluids (e.g., conductive fluids, such as water) onto the smart carbon coating 64, in a generally similar manner as described with respect to FIG. 7.

Figure 10:
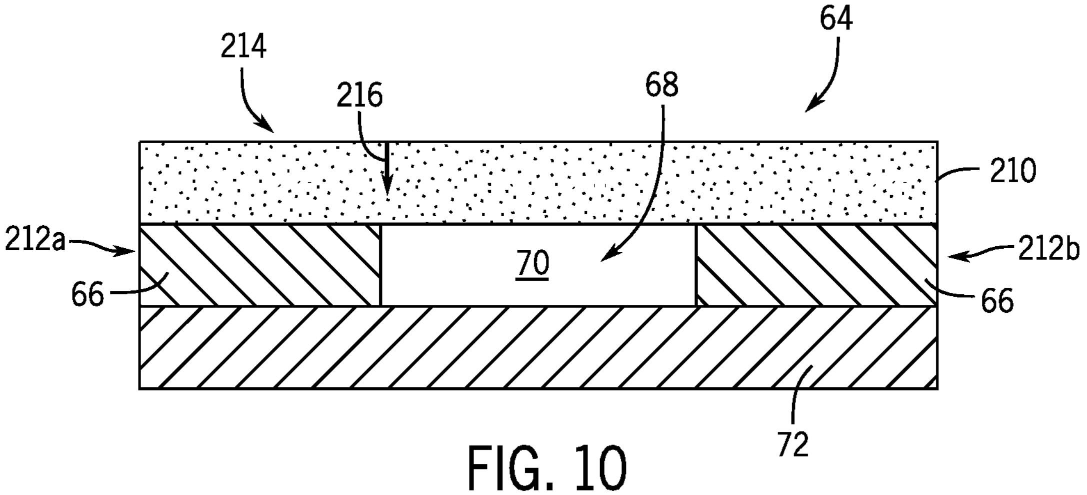
FIG. 10 is a cross-sectional side view of an embodiment of the smart carbon coating on a substrate with embedded active area.

To illustrate another embodiment of the treated carbon region 68 of the smart carbon coating 64, FIG. 10 is a cross-sectional side view of an embodiment of the smart carbon coating 64 having a non-conductive layer 210. As shown, the non-conductive layer 210 is disposed above the treated carbon region 68 that includes an electrically conductive carbon material 70 disposed between two regions 212*a* and 212*b* of carbon rich layer 66 coating a substrate 72.

In certain embodiments, the treated carbon region 68 including non-conductive layer 210 may be utilized as a strain gauge. For example, if a material (e.g., a scale deposit) settles, deposits, or otherwise accumulates on the top side 214 of the non-conductive layer 210, a strain (e.g., in the direction 216) may be applied to the electrically conductive carbon material 70. Accordingly, the strain in the direction 216 may induce a change in the electrical or mechanical properties of the electrically conductive carbon material 70 (e.g., an electric circuit or a printed circuitry including the electrically conductive carbon material 70), and thus, produce a detectable change in the properties of the electrically conductive carbon material 70. The detectable change may be used to determine the amount or rate of scale deposit. In this way, the treated carbon region 68 may be utilized to identify strain applied to a machine component coated with the smart carbon coating 64.

To further illustrate various embodiments of the carbon rich layer 66, Table 1 provides example embodiments of the carbon rich layer 66 produced by a PACVD process, wherein the carbon rich layer 66 has different carbon contents, among others. It should be noted that although the examples are produced by a PACVD process, other suitable processes such as chemical vapor deposition (CVD), physical vapor deposition (PVD), plasma-assisted/plasma-enhanced CVD (PACVD, PECVD), plasma-based ion implantation and deposition (PBII&D), ionized evaporation (IE), sputtering (SP) or others may be used to produce the carbon rich layer 66. For example, an embodiments of the carbon rich layer 66 may have a $sp^3$ carbon content greater than 40%, greater than 45%, greater than 50%, between 40%-60%. Additionally, or alternatively, example embodiments of the carbon rich layer 66 may have a carbon content with a $sp^2/sp^3$ ratio less than 1.5, less than 1.0, less than 0.8, less than 0.7, less than 0.6, or between 1.5-0.6, between 1.5-1.0, between 1.0-0.6, and other ranges represented in Table 1. In examples presented in Table 1, the carbon rich layers were produced with a range of thickness between approximately 0.2 µm and 30 µm, and fall under a broad range of designations. These carbon rich layers include hydrogen and silicon. Some of the carbon-rich layers are single layered and other double-layered. As a result of their different deposition process parameters and compositional differences, carbon layers with average Vickers hardness between 925 and 1550 were produced, indirectly causing a range of desirable coefficient of frictions. Because of the carbon film thickness, hardness was converted from Berkovich nano- and micro-indentation tests conducted with a hardness indenter and reported as average of a minimum of ten measurements. A friction coefficient was measured against a standard stainless-steel ball under dry and dynamic conditions as per a procedure modified from ASTM G99. To quantify or determine the relative amounts of $sp^2$ carbon and $sp^3$ carbon, suitable techniques such as X-ray Photoelectron Spectroscopy (XPS) may be used. The ratios of $sp^2/sp^3$ were measured by X-ray Photoelectron Spectroscopy (XPS). The C1s XPS peak was recorded from the surface of the carbon rich layer. The C1s peak was deconvoluted to four Gaussian peaks attributed to $sp^3$(~284.5 eV), $sp^2$(~285.1 eV), C—O (~286.8 eV) and C═O (~288.4 eV). The $sp^2/sp^3$ and sp2/(sp3+sp3) were calculated based on their peak areas.

TABLE 1

Example carbon rich layer properties and deposition methods.

| | Thickness (µm) | Designation | Composition | Construction | Hardness (HV) | Friction Coefficient | $sp^2/sp^3$ | $sp^2/(sp^2 + sp^3)$ % |
|---|---|---|---|---|---|---|---|---|
| #1 | 30 | a-C:H:Si | C, O, Si | Multi-layer | 925 | 0.08 | 0.77 | 43 |
| #2 | 12-15 | a-C:H:Si | C, O, Si | Double layer | 1059 | 0.05 | 0.53 | 34 |
| #3 | 1.5 | a-C:H:Cr/W | C, Cr, W | Single layer | 1845 | 0.12 | 0.62 | 38 |
| #4 | 2 | a-C:H:W | C, W | Single layer | 2000 | 0.12 | 0.62 | 38 |
| #5 | 0.2 | Polymerlike Carbon films | C, Si | Single layer | 968 | 0.15 | N/A | N/A |
| #6 | 15 | a-C:H:Si | C, O, Si | Multi-layer | 1055 | 0.08 | 1.5 | 60 |
| #7 | 5-7 | a-C:H:Si | C, O, Si | Double layer | 1547 | 0.05 | 0.82 | 45 |

N/A: Not available

As described herein, treating the carbon rich layers 66 with a laser may produce a treated carbon region 68 having an increased $sp^2$ content relative to the carbon rich layers 66. Table 2 shows exemplary results from laser treating the carbon coating 84, illustrating the increased $sp^2$ content. In Table 2, the sheet electrical resistance is reported as an average of at least 6 consecutive measurements. Sheet electrical resistance was measured using R-check Four Point Sheet Resistance Meter (EDTM). In order to make the measurements consistent from a power level to another, as shown in Table 2, the laser treatment was pre-programmed to create parallel and overlapping treated lines eventually forming a well-defined square region of 645 $mm^2$, that is a treated region with a total area large enough for reliable sheet electrical resistance measurements.

TABLE 2

Example treatments of carbon rich layers 66

| Relative laser Power (100% = 5 W) | Sheet electrical resistance (Rs) in Ohms per square | sp2/(sp2 + sp3) % | sp2/sp3 |
|---|---|---|---|
| 0 | >20,000 | 50 | 1.0 |
| 50 | 153 | 66 | 2.0 |
| 60 | 51 | 69 | 2.3 |
| 70 | 53 | 70 | 2.4 |

In this example, a 20 W, 450 nm laser was specifically used to form the treated carbon region 68. As shown in Table 2, increasing the laser power reduces the sheet electrical resistance of the carbon coating 84 required to produce the smart carbon coating 64. Furthermore, increasing the laser power increased the relative $sp^2$, which is shown by the increased $sp^2$ percentage and $sp^2/sp^3$ ratio. For example, forming the treated carbon region 68 may conveniently reduce the sheet electrical resistance by less than $1/100$ of the sheet electrical resistance of the untreated carbon layers 66. In Table 2, with 70 percent laser power, sheet electrical resistance is as low as $1/400$.

Figure 11:
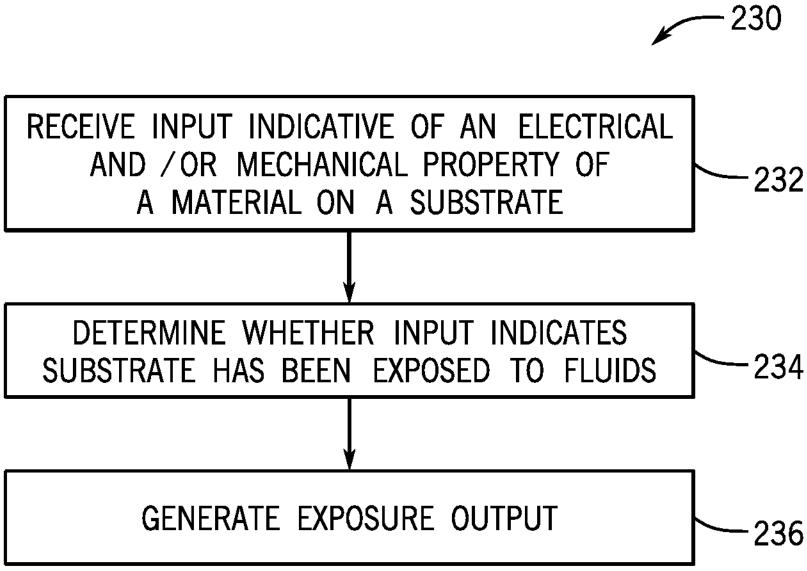
FIG. 11 is a flow diagram of an embodiment of a process for generating a machine component damage output based on a change in electrical properties, mechanical properties, or both, of a smart carbon coating.

To illustrate operation of the embodiments of components of the surface monitoring system 90 described in FIG. 5, FIG. 11 illustrates an embodiment of a process 230 for generating a corrosion detection output, a scale detection output, a strain detection output, or a combination thereof, such as an alert or a control signal to modify operation of components of a subterranean well system 10. Although the process 230 is described as being performed by the computing device 108, any suitable machine or processor-based device capable of communicating with other components of the surface monitoring system 90 may perform the disclosed process 230 including, but not limited to, the controller 116, and the like.

At block 232, the surface monitoring system 90 may acquire property data using the electrical monitoring system 96. For example, in an embodiment where the surface monitoring system 90 includes the electrical monitoring system 96, the surface monitoring system 90 may activate electrodes to cause the electrodes of the electrical monitoring system 96 to induce a current (e.g., by applying a voltage) across the smart carbon coating 64 and the electrical monitoring system 96 may acquire data indicative of the electrical property of the smart carbon coating 64 based on the current provided to the one or more smart carbon coating 64. For example, the surface monitoring system 90 may determine a magnitude of the change in the electrical property (e.g., based on a relative change). At block 234, the surface monitoring system 90 may determine whether the substrate 64 has been exposed to fluids, stress (e.g., stress exceeding a threshold), an amount of scale (e.g., a mass of scale), a pressure induced by fluids or a solid material in the like, based on the electrical property data. In some embodiments, the surface monitoring system 90 may determine whether the substrate 64 needs maintenance, or needs to be replaced, based on the electrical property data. For example, the surface monitoring system 90 may determine a change in resistance, and/or other properties as discussed herein, indicative of exposure of a mechanical component having the smart carbon coating 64 to one or more fluids, such as water, carbon dioxide, sour gas, hydrogen, among others. In general, the surface monitoring system 90 may compare the electrical property (e.g., or a corresponding mechanical property such as pressure, as described with respect to FIGS. 13 and 16), to a threshold or threshold range and determine whether the electrical property exceeds a threshold or is within or outside of the threshold range.

At block 236, the surface monitoring system 90 may generate a damage output (e.g., a mechanical component damage output and/or a component damage output). In general, the damage output may include an audible and/or visual alert (e.g., a notification displayed on a computing device, such as a laptop, mobile device, tablet, or otherwise) or cause a component of the subterranean well system 10 to modify operation. For example, the damage output may be a control signal or activation signal that causes a device utilizing the mechanical component coated with the smart carbon coating 64 to stop operating or change operation or position. As another non-limiting example, the control signal may cause a drill to stop drilling, a valve to open or close, and/or a fluid flow rate to change. In some embodiments, the damage output may be an indication or alert displayed on a computing device, indicating a likelihood that a mechanical component (e.g., a fluid handling component, a well closure component, a mineral extraction component, a hydrocarbon extraction component, a sequestration component, or any combination thereof) has been exposed to fluids. In some embodiments, the notification may indicate a magnitude of the exposure to fluids, material or otherwise that includes a mechanical and/or chemical change of the smart carbon coating 64 (e.g. based on the change in the electrical properties). For example, the alert may warn a user that the mechanical component was likely damaged as well as the extent of the damage (e.g., determined based on a magnitude change or the location of the change in electrical properties) and/or a time period when the vehicle was likely damaged. In some embodiments, the surface monitoring system 90 may determine an estimated time period for subsequent use of the mechanical component coated with the smart carbon coating 64 prior to inspection, repair, or replacement. For example, the surface monitoring system 90 may use a reference table (e.g., storing relationships between a magnitude of exposure and a time for replacement or maintenance) stored in a memory and the magnitude of the exposure to determine the estimate time period. As such, the surface monitoring system 90 may include the estimated time period in the notification or alert.

Figure 12:
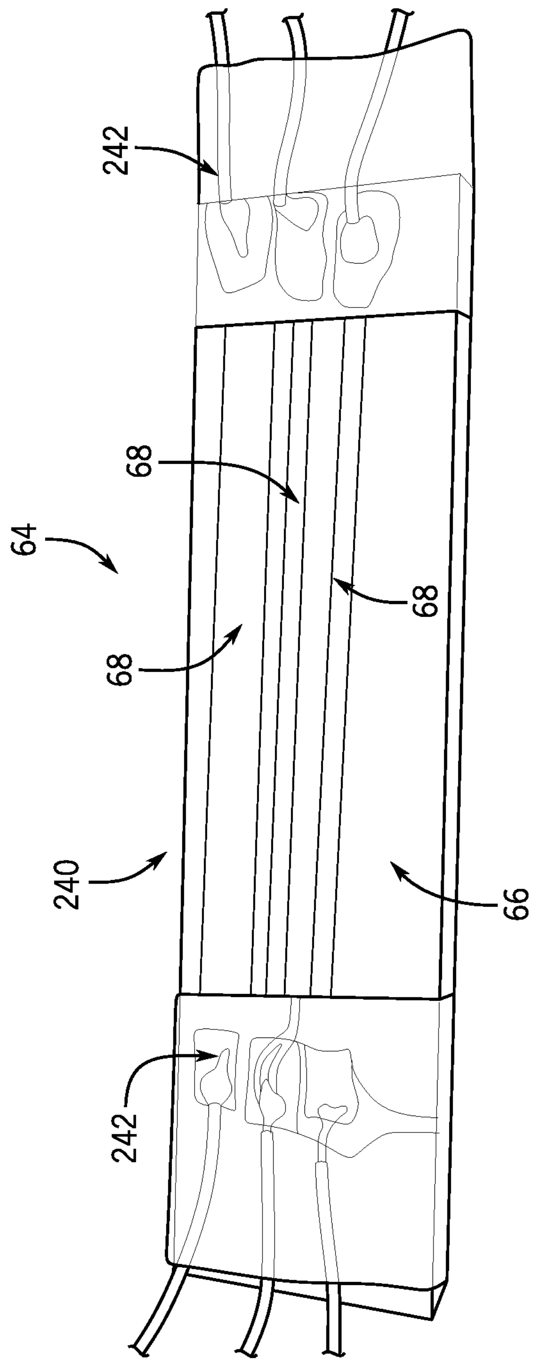
FIG. 12 is an image of a device that includes the smart carbon coating using the smart carbon coating monitoring system of FIG. 5.

To illustrate an embodiment of the smart carbon coating monitoring system of FIG. 5, FIG. 12 is an image of a device 240 that includes the smart carbon coating 64 that is coupled to interconnects 242. In illustrated embodiment, the smart carbon coating 64 includes three treated carbon regions 68, which are generally rectangular portions. Further, the treated carbon regions 68 are connected to wires using a thin copper foil (i.e., the interconnect 242 and conductive epoxy.

Figure 13:
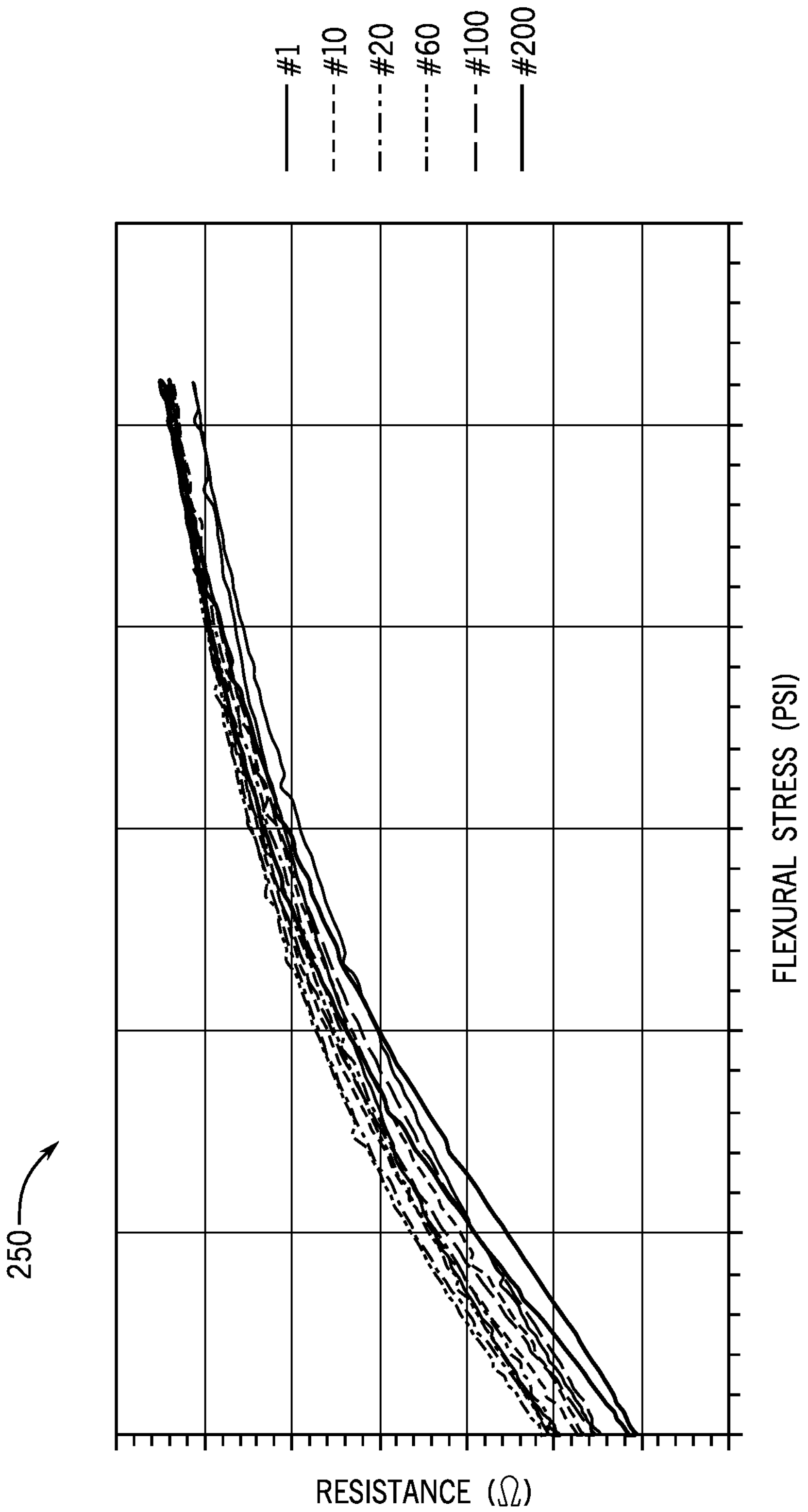
FIG. 13 is a graph showing a measured resistance of a smart carbon coating versus a pressure applied to a substrate under multiple cycles.

FIG. 13 is a graph showing a measured resistance (e.g., the y-axis) of a smart carbon coating versus a pressure applied (e.g., the x-axis) to a substrate coating with the smart carbon coating 64. More specifically, the graph 250 shows the resistance changes for different loads that produced flexural stresses as high as 60 ksi for up to 200 cycles of application of the different loads. In general, the graph 250 shows a quasi-linear change of resistance versus pressure for up to 200 cycles. Accordingly, a measured electrical property may be used to determine whether the smart carbon coating 64 is subject to a mechanical load, and changes in in resistance can correlate (e.g., directly correlate) to changes in loading conditions.

Figure 14:
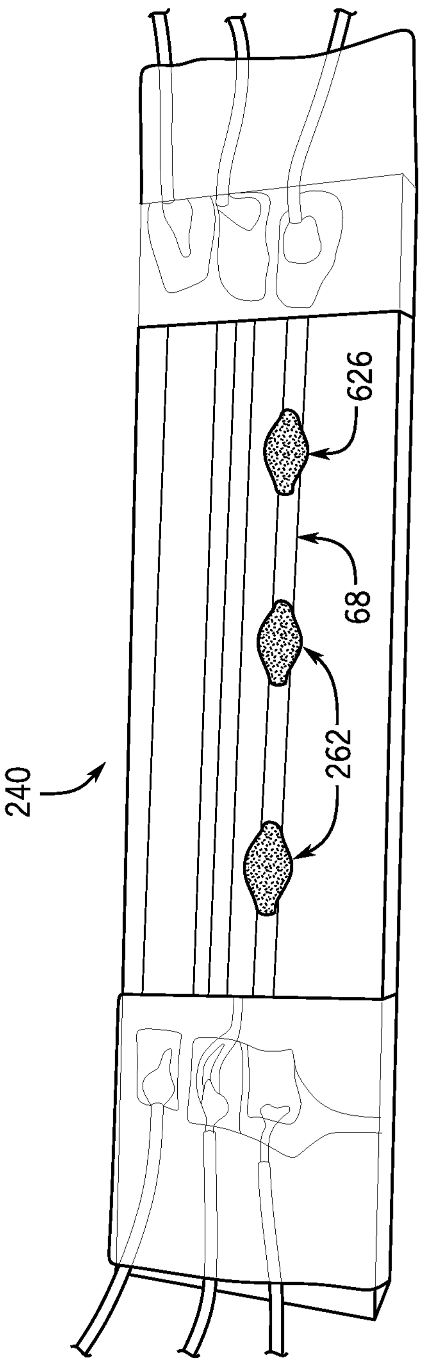
FIG. 14 is an image of the device of FIG. 12 that is exposed to fluids (in FIG. 14)
Figure 15:
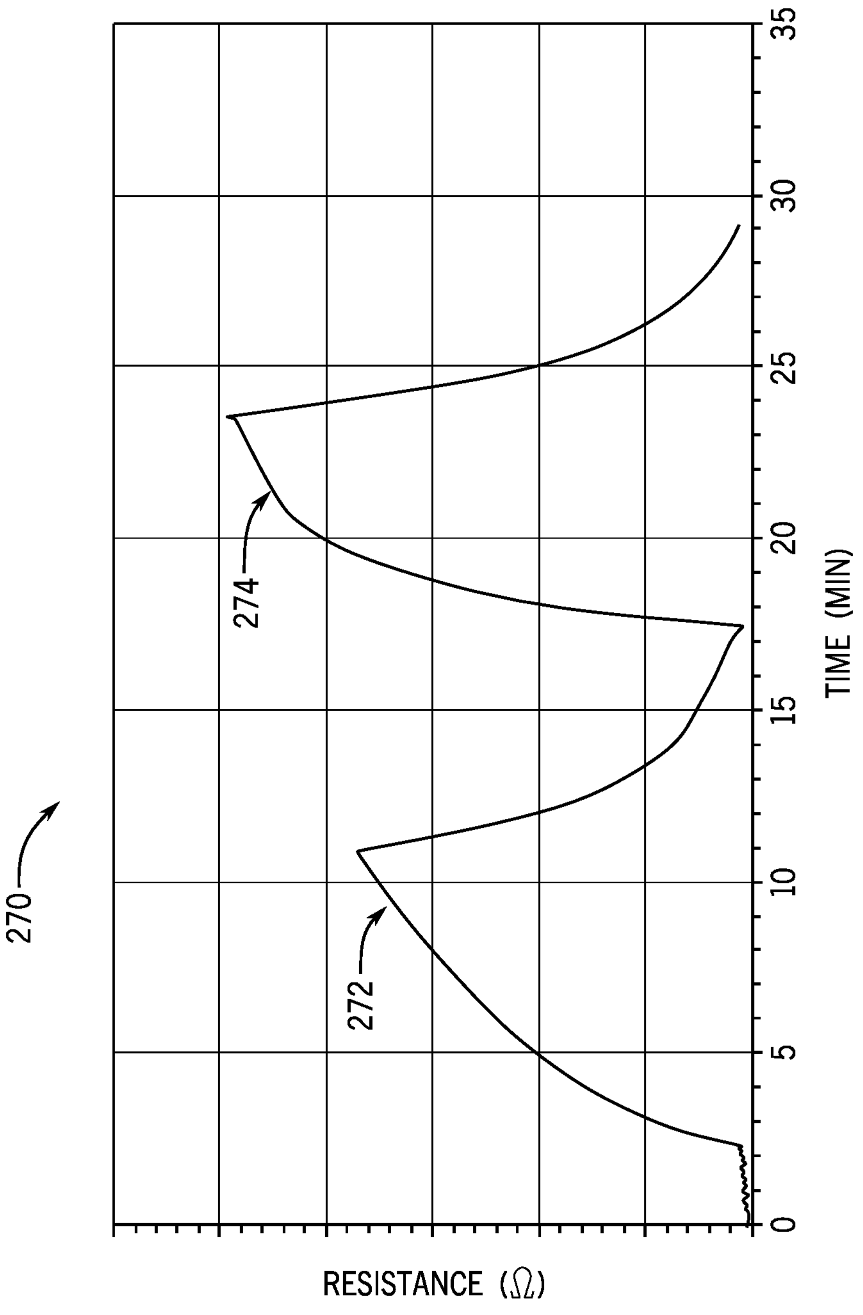
FIG. 15 is a graph showing a measured resistance versus time of a smart carbon coating being exposed to a fluid.

FIG. 14 is an image of the device 242 of FIG. 12 that is exposed to fluids. In particular, the device 242 includes fluid droplets 262 of a conductive fluid (e.g., water) deposited onto a treated carbon portion 68. The effect of the fluid droplets 262 onto the treated carbon portion 68 is illustrated in FIG. 15, which shows a graph 270 showing a measured resistance versus time of a smart carbon coating being exposed to the fluid droplets 262. In particular, the graph 270 shows a first peak 272 corresponding to deposition of one or more of the fluid droplets 262. A second peak 274 corresponds to deposition of an additional droplet of the conductive fluid after removal (e.g., cleaning) of the droplet corresponding to the first peak 272.

Figure 16:
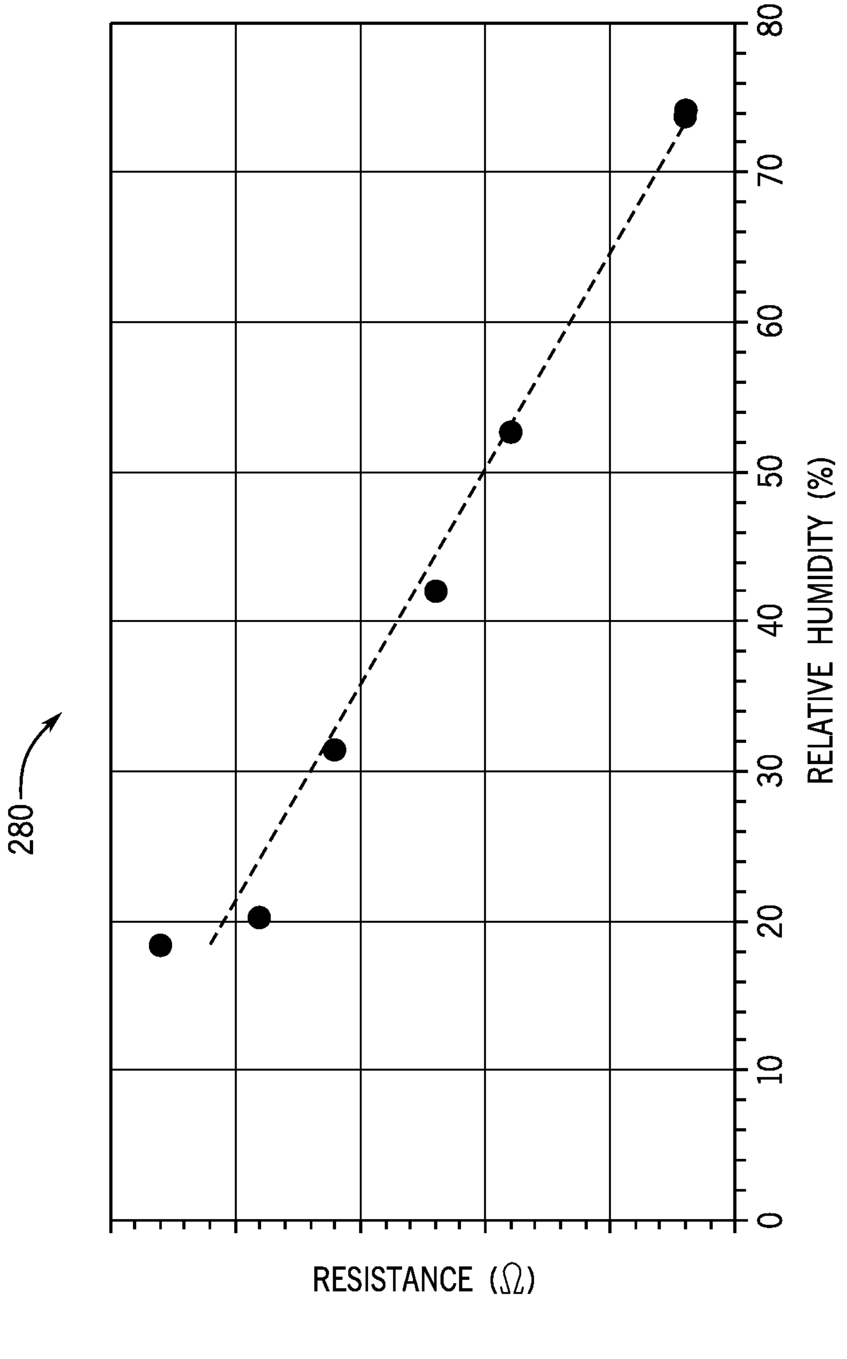
FIG. 16 is a graph showing measured resistance versus relative humidity of an environment where a smart carbon coating was utilized.

FIG. 16 is a graph 280 showing measured resistance (e.g., the y-axis) versus relative humidity (e.g., the x-axis) of an environment where a smart carbon coating was utilized. In this example, a substrate coating with the smart carbon coating 64 was kept in a humid environment for a predetermined time period. As shown in the graph 280, the measured resistance has a substantially linear relationship with the relative humidity of the environment. Accordingly, the resistance may be used to indicate the exposure of the smart carbon coating 64 to a humid environment and the relative humidity of the humid environment.

Accordingly, the present disclosure relates to a smart carbon coating 64 that includes carbon rich layer 66 with a treated carbon region 68 with an improved ability to prevent, mitigate, or block scale formation (e.g., scale precipitation) on various equipment, such as downhole components. As discussed herein, it is presently recognized that improved scale mitigation is achieved with a carbon rich layer 66 having one or more regions with a carbon content greater than 40 percent $sp^3$ carbon and/or a $sp^2/sp^3$ ratio of the carbon content is less than 1.5, wherein the improved scale mitigation is substantially better than coatings with a carbon content with less than 40 percent $sp^3$ carbon. Furthermore, the treated carbon region 68 may have a relatively low sheet electrical resistance, and thus, function as a circuit on the surface of the smart carbon coating 64 that may be used for detecting exposure of the smart carbon coating 64 or a machine component coated with the smart carbon coating 64 to certain fluids.

This written description uses examples to disclose the subject matter, including the best mode, and also to enable any person skilled in the art to practice the subject matter, including making and using any devices or systems and performing any incorporated methods. The patentable scope of the subject matter is defined by the claims and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A system, comprising:

a substrate;

a carbon rich coating deposited onto a surface of the substrate, wherein the carbon rich coating comprises a non-conductive carbon region having a first carbon content characterized by its $sp^2$ carbon and $sp^3$ carbon; and wherein the carbon rich coating comprises one or more laser treated carbon regions, wherein the one or more laser treated carbon regions comprise an electrically conductive induced pattern comprising at least one interconnect, wherein the electrically conductive induced pattern has a second carbon content characterized by its $sp^2$ carbon and $sp^3$ carbon, wherein the second carbon content comprises more $sp^2$ carbon than the first carbon content, wherein a sheet electrical resistance of the one or more laser treated carbon regions is less than a sheet electrical resistance of the non-conductive carbon region.

2. The system of claim 1, wherein the first carbon content has greater than 40% $sp^3$ carbon.

3. The system of claim 1, wherein a first $sp^2/sp^3$ ratio of the first carbon content is less than a second $sp^2/sp^3$ ratio of the second carbon content.

4. The system of claim 3, wherein the second $sp^2/sp^3$ ratio is greater than 1.5.

5. The system of claim 1, wherein the second carbon content comprises greater than 50% $sp^2$ carbon.

6. The system of claim 1, wherein the sheet electrical resistance of the one or more laser treated carbon regions is less than 1/100 of the sheet electrical resistance of the non-conductive carbon region.

7. The system of claim 1, wherein the second carbon content comprises greater than 65% $sp^2$ carbon.

8. The system of claim 1, wherein the non-electrically conductive coating comprises a Vickers hardness greater than 750.

9. The system of claim 1, wherein the sheet electrical resistance of the one or more laser treated carbon regions is less than 1000 Ω per sq.

10. The system of claim 1, wherein the electrically conductive induced pattern comprises an electric circuit, wherein the electric circuit is configured to produce a detectable change in an electrical property due to stresses applied to or resulting in the one or more laser treated carbon regions.

11. The system of claim 1, wherein the carbon rich layer comprises multiple carbon rich layers, wherein each carbon rich layer comprises a different carbon content.

12. The system of claim 1, wherein the carbon rich coating comprises a thickness between 0.5 μm and 30 μm.

13. The system of claim 1, wherein the carbon rich layer comprises a coefficient of friction less than 0.15 against stainless steel.

14. The system of claim 1, further comprising:

a surface monitoring system configured to measure data indicative of a change in surface characteristics of the carbon rich coating deposited onto a surface of the substrate, wherein the substrate is a downhole component; and a non-transitory machine-readable medium and executable by a processor to: identify the change in the surface characteristics in response to the data; and output an indication of the change.

15. The system of claim 14, wherein the one or more laser treated carbon regions comprise branches extending along a surface of the downhole component, wherein the surface monitoring system is configured to detect strain applied to the branches extending along the surface of the downhole component.

16. The system of claim 14, wherein the at least one interconnect is created by depositing a conductive metal selected from the group consisting of copper, gold, and silver onto the laser treated carbon region.

17. A method, comprising:

measuring an electrical property of a substrate coated with a carbon rich layer comprising a first carbon content characterized by its $sp^2$ carbon and $sp^3$ carbon, wherein the carbon rich layer comprises one or more laser treated carbon regions having an electrically conductive induced pattern comprising at least one interconnect, wherein the electrically conductive induced pattern has a second carbon content characterized by its $sp^2$ carbon and $sp^3$ carbon, wherein the second carbon content comprises more sp-carbon than the first carbon content;

determining a change in the measured electrical property of the substrate; and determining a mechanical condition, chemical condition, or both, of the substrate based on the changed in the measured electrical property.

18. The method of claim 17, comprising determining the mechanical condition of the substrate, wherein the mechanical condition is a stress, a strain, or both, applied to the substrate.

19. The method of claim 17, comprising determining the chemical condition of the substrate, wherein the chemical condition is a presence of fluids on or near the substrate.

* * * * *